(12) United States Patent
Sammoura et al.

(10) Patent No.: US 10,569,302 B2
(45) Date of Patent: Feb. 25, 2020

(54) BIOMETRIC SENSOR WITH FORCE DETECTION AND ULTRASONIC IMAGING CAPABILITY

(71) Applicant: QUALCOMM Incorporated, San Diego, CA (US)

(72) Inventors: Firas Sammoura, Dublin, CA (US); David William Burns, San Jose, CA (US); Ravindra Vaman Shenoy, Dublin, CA (US)

(73) Assignee: Qualcomm Incorporated, San Diego, CA (US)

( * ) Notice: Subject to any disclaimer, the term of this patent is extended or adjusted under 35 U.S.C. 154(b) by 325 days.

(21) Appl. No.: 15/633,386

(22) Filed: Jun. 26, 2017

(65) Prior Publication Data

US 2018/0369866 A1    Dec. 27, 2018

(51) Int. Cl.
*H01L 41/08*    (2006.01)
*B06B 1/06*    (2006.01)
*G06K 9/00*    (2006.01)

(52) U.S. Cl.
CPC .......... *B06B 1/0622* (2013.01); *G06K 9/0002* (2013.01); *H01L 41/0825* (2013.01)

(58) Field of Classification Search
CPC .. B06B 1/0622; G06K 9/0002; H01L 41/0825
USPC .......... 310/322, 324, 328, 334, 338
See application file for complete search history.

(56) References Cited

U.S. PATENT DOCUMENTS

| 8,110,963 B2 | 2/2012 | Funasaka et al. |
| 8,970,507 B2 | 3/2015 | Holbein et al. |
| 2008/0166028 A1 | 7/2008 | Turek et al. |
| 2014/0232241 A1* | 8/2014 | Hajati ............... B81B 7/008 310/317 |
| 2015/0123931 A1 | 5/2015 | Kitchens et al. |
| 2015/0169136 A1 | 6/2015 | Ganti et al. |

(Continued)

OTHER PUBLICATIONS

International Search Report and Written Opinion—PCT/US2018/034214—ISA/EPO—dated Aug. 16, 2018.

(Continued)

*Primary Examiner* — Thomas M Dougherty
(74) *Attorney, Agent, or Firm* — Weaver Austin Villeneuve & Sampson LLP

(57) ABSTRACT

Implementations of the subject matter described herein relate to sensors including piezoelectric micromechanical ultrasonic transducer (PMUT) sensor elements and arrays thereof. The PMUT sensor elements may be switchable between a non- ultrasonic force detection mode and an ultrasonic imaging mode. A PMUT sensor element may include a diaphragm that is capable of a static displacement on application of a force and is capable of a dynamic displacement when the PMUT sensor element transmits or receives ultrasonic signals. In some implementations, a PMUT sensor element includes a two dimensional-electron gas structure on the diaphragm. The sensors may further include a sensor controller configured to switch between a non-ultrasonic force detection mode and an ultrasonic imaging mode for one or more of the PMUT sensor elements, wherein an applied force is measured in the non-ultrasonic force detection mode and wherein an object is imaged ultrasonically during the ultrasonic imaging mode.

12 Claims, 26 Drawing Sheets

(56) References Cited

U.S. PATENT DOCUMENTS

| | | |
|---|---|---|
| 2015/0253935 A1 | 9/2015 | Toda et al. |
| 2016/0107194 A1 | 4/2016 | Panchawagh et al. |
| 2017/0110504 A1* | 4/2017 | Panchawagh ........... H01L 27/20 |
| 2019/0286868 A1* | 9/2019 | Suwald .............. G06K 9/00053 |
| 2019/0286872 A1* | 9/2019 | Lu ......................... G06K 9/001 |

OTHER PUBLICATIONS

Qiu Y., et al., "Piezoelectric Micromachined Ultrasound Transducer (PMUT) Arrays for Integrated Sensing, Actuation and Imaging", Sensors, vol. 15, No. 4, Apr. 3, 2015, pp. 8020-8041, XP055309471, DOI: 10.3390/S150408020.

Rais-Zadeh M., et al., "Gallium Nitride as an Electromechanical Material", Journal of Microelectromechanical Systems, IEEE Service Center, US, vol. 23, No. 6, Dec. 1, 2014, XP011565560, ISSN: 1057-7157, DOI: 10.1109/JMEMS.2014.2352617 [retrieved on Nov. 25, 2014], pp. 1252-1271.

Wikipedia: "Ultrasonic transducer—Wikipedia", Wikipedia, the free encyclopedia, Apr. 17, 2007, XP055498247, Retrieved from the Internet: URL:https://web.archive.org/web/20170417234946/https://en.wikipedia.org/wiki/Ultrasonic_transducer [retrieved on Aug. 8, 2018], 3 pages.

\* cited by examiner

BIOMETRIC SENSOR WITH FORCE DETECTION AND ULTRASONIC IMAGING CAPABILITY

TECHNICAL FIELD

This disclosure relates to piezoelectric ultrasonic transducers and to an electronic sensor array of piezoelectric ultrasonic transducers for biometric sensing, imaging, force detection and touch recognition.

DESCRIPTION OF THE RELATED TECHNOLOGY

Ultrasonic sensor systems may use an ultrasonic transmitter to generate and send an ultrasonic wave through an ultrasonically transmissive medium or media and towards an object to be detected. The ultrasonic transmitter may be operatively coupled to an ultrasonic sensor array configured to detect portions of the ultrasonic wave that are reflected from the object. For example, in ultrasonic fingerprint sensors, an ultrasonic wave may be produced by starting and stopping the transmitter during a short interval of time. At each material interface encountered by the ultrasonic wave, a portion of the ultrasonic wave may be reflected.

For example, in the context of an ultrasonic fingerprint sensor, the ultrasonic wave may travel through a platen on which an object such as a person's finger may be placed to obtain fingerprint image information. After passing through the platen, some portions of the ultrasonic wave may encounter skin that is in contact with the platen, e.g., fingerprint ridges, while other portions of the ultrasonic wave encounter air, e.g., valleys between adjacent ridges of a fingerprint, and may be reflected with different intensities back towards the ultrasonic sensor array. The ultrasonic sensor array may convert the reflected ultrasonic wave into reflected ultrasonic signals that are indicative of the local intensity of the reflected ultrasonic wave. The reflected signals associated with the finger may be processed and converted to digital values representing the signal strengths of the reflected signals. When such reflected signals are collected over a distributed area, the digital values of such signals may be used to produce fingerprint image information. The fingerprint image information may be used to produce a graphical display of the signal strength over the distributed area, for example by converting the digital values to an image, thereby producing an image of the fingerprint. Thus, an ultrasonic sensor system may be used as a fingerprint sensor or other type of biometric scanner.

Thin film piezoelectric acoustic transducers are attractive candidates for numerous applications including biometric sensors, ultrasonic imaging devices and fingerprint sensors. Such transducers may include piezoelectric micromechanical ultrasonic transducers (PMUTs) configured as a multi-layer stack that includes a piezoelectric layer stack and a mechanical layer disposed over a cavity. The piezoelectric layer stack may include a layer of piezoelectric material. In some applications, a one- or two-dimensional array of any number of PMUT sensor elements may be contemplated.

Low-cost and low-power authenticating wake-up mechanisms are of interest in electronic devices such as smartphones, tablets, and self-driving cars, but significant challenges are present. Capacitive touch detection mechanisms may be unable to differentiate a determined touch from an inadvertent one, leading to unwanted wake-up events. A light touch by a finger on a fingerprint sensor may result in poor image quality, making authentication of a user more difficult.

SUMMARY

The systems, methods and devices of this disclosure each have several innovative aspects, no single one of which is solely responsible for the desirable attributes disclosed herein.

One innovative aspect of the subject matter described in this disclosure relates to an apparatus including a substrate; a sensor including an array of piezoelectric micromechanical ultrasonic transducer (PMUT) sensor elements on the substrate, where each PMUT sensor element includes a diaphragm having a piezoelectric layer and a mechanical layer, where the diaphragm is capable of a static displacement upon application of an applied force and is capable of a dynamic displacement when the PMUT sensor element receives or transmits ultrasonic signals; and a sensor controller configured to switch the sensor between a non-ultrasonic force detection mode and an ultrasonic imaging mode for one or more of the PMUT sensor elements, where the applied force is measured in the non-ultrasonic force detection mode and where an object is imaged ultrasonically during the ultrasonic imaging mode. In some implementations, the apparatus is configured to detect a finger touch based on an on-threshold force being measured by the apparatus in the non-ultrasonic force detection mode. In some implementations, the sensor controller may be configured to provide, to an applications processor, a wake-up signal to activate one or more wake-up operations after the finger touch is detected. In some such implementations, the apparatus is configured to detect a finger lift after a detecting the finger touch based on an off-threshold force being measured by the apparatus in the non-ultrasonic force detection mode. In some implementations, the off-threshold force is less than the on-threshold force. In some implementations, the sensor controller is configured to initialize the ultrasonic imaging mode after the finger touch is detected.

In some implementations, the sensor controller is configured to initialize the ultrasonic imaging mode based on a minimum imaging threshold force being measured by the apparatus in the non-ultrasonic force detection mode. In some implementations, one or more of the PMUT sensor elements includes a 2-D electron gas structure disposed on the diaphragm. In some implementations, the sensor controller is configured to switch between the non-ultrasonic force detection mode and an ultrasonic imaging mode for each of the PMUT sensor elements in the array of PMUT sensor elements. In some implementations, the sensor controller is configured to switch between the non-ultrasonic force detection mode and an ultrasonic imaging mode for a subset of the PMUT sensor elements in the array of PMUT sensor elements.

In some implementations, PMUT sensor elements of the subset of the PMUT sensor elements are located at the periphery of the array of PMUT sensor elements. In some such implementations, the PMUT sensor elements of the subset of the PMUT sensor elements differ from the remainder of the PMUT sensor elements of the array of PMUT sensor elements in one or more of a shape or a size.

Another innovative aspect of the subject matter described in this disclosure relates to a method of operating a fingerprint sensor, including measuring a finger force of a finger positioned on the fingerprint sensor, imaging the finger when the finger force exceeds a pressed-finger threshold level, and authenticating the finger based on imaging the finger. In some implementations, imaging the finger includes acquiring ultrasonic image information of the finger and where authenticating the finger is based on the ultrasonic image information. In some implementations, imaging the finger includes acquiring ultrasonic image information of the finger when the finger force exceeds a minimum imageable-finger threshold level. In some implementations, imaging the finger includes acquiring ultrasonic image information of the finger when the finger force is less than a maximum imageable-finger threshold level. In some implementations, the method further includes waking up at least a portion of a mobile device when the finger force exceeds the pressed-finger threshold level. In some implementations, the method further includes reducing a sampling rate for measuring the finger force when the finger force is less than a lifted-finger threshold level.

Another innovative aspect of the subject matter described in this disclosure relates to an apparatus including a substrate; a diaphragm including a mechanical layer disposed over a cavity, the cavity being positioned between the diaphragm and the substrate; and a 2-D electron gas structure disposed on the diaphragm. In some implementations, the 2-D electron gas structure is an aluminum gallium nitride/ gallium nitride (AlGaN/GaN) transistor. In some implementations, the diaphragm and the 2-D electron gas structure are part of a sensor element, the diaphragm is capable of a static displacement upon application of an applied force, and the 2-D electron gas structure is a strain-sensitive structure configured to provide a static displacement signal that corresponds to the applied force. In some implementations, the diaphragm is further capable of a dynamic displacement when the sensor element receives or transmits ultrasonic signals. In some such implementations, the apparatus further includes a sensor controller configured to switch the sensor element between a non-ultrasonic force detection mode and an ultrasonic imaging mode, where the applied force is measured in the non-ultrasonic force detection mode and where an object is imaged ultrasonically during the ultrasonic imaging mode.

In some implementations where the sensor element is one of an array of sensor elements on the substrate, each sensor element includes a diaphragm and a mechanical layer disposed over a cavity, the cavity being positioned between the diaphragm and the substrate, and each sensor element includes a 2-D electron gas structure disposed on the diaphragm. In some implementations, the apparatus further includes an array of piezoelectric micromechanical ultrasonic transducer (PMUT) sensor elements on the substrate.

In some implementations, the apparatus further comprises a piezoelectric layer stack disposed on the diaphragm, where the piezoelectric layer stack is configured to excite the diaphragm and generate ultrasonic waves. In some implementations, the 2-D electron gas structure is configured to detect static displacements or dynamic displacements of the diaphragm.

Another innovative aspect of the subject matter described in this disclosure relates to a non-transitory computer readable medium storing instructions executable by one or more processors coupled to a fingerprint sensor, the fingerprint sensor including an array of piezoelectric ultrasonic transducer (PMUT) sensor elements, the instructions including: instructions for operating the PMUT sensor elements in a force detection mode; instructions for measuring an applied force on the fingerprint sensor operating in the force detection mode; instructions for determining that a finger of a user has touched the fingerprint sensor based on the measured applied force; instructions for operating the PMUT sensor elements in an ultrasonic imaging mode to acquire fingerprint image information of the finger; and instructions for authenticating the user based on the fingerprint image information.

In some implementations, the instructions for determining that a finger has touched the fingerprint sensor based on the applied force include instructions for comparing the applied force to an on-threshold force. In some implementations, the instructions further include instructions for determining, after detecting that the finger has touched the fingerprint sensor, that the finger has lifted off the fingerprint sensor based on an off-threshold force being measured by the apparatus in the non-ultrasonic force detection mode. In some such implementations, the off-threshold force is less than the on-threshold force. In some implementations, the apparatus further includes instructions for determining that the applied force is greater than or equal to a minimum imaging threshold force. In some implementations, the apparatus further includes instructions for initializing the ultrasonic imaging mode after determining that the applied force is greater than or equal to a minimum imaging threshold force.

Another innovative aspect of the subject matter described in this disclosure relates to an apparatus including a substrate; a sensor including an array of piezoelectric micromechanical ultrasonic transducer (PMUT) sensor elements on the substrate, where each PMUT sensor element includes a diaphragm having a piezoelectric layer and a mechanical layer, where the diaphragm is capable of a static displacement upon application of an applied force and is capable of a dynamic displacement when the PMUT sensor element receives or transmits ultrasonic signals; and means electrically coupled to the sensor for switching the sensor between a non-ultrasonic force detection mode and an ultrasonic imaging mode for one or more of the PMUT sensor elements, where the applied force is measured in a non-ultrasonic force detection mode and where an object is imaged ultrasonically during an ultrasonic imaging mode. In some implementations, the apparatus further includes means for determining that a finger has touched the sensor. In some implementations, the apparatus further includes means for determining that the finger has lifted off the sensor.

BRIEF DESCRIPTION OF THE DRAWINGS

Details of one or more implementations of the subject matter described in this specification are set forth in this disclosure and the accompanying drawings. Other features, aspects and advantages will become apparent from a review of the disclosure. Note that the relative dimensions of the drawings and other diagrams of this disclosure may not be drawn to scale. The sizes, thicknesses, arrangements, materials, etc., shown and described in this disclosure are made only by way of example and should not be construed as limiting. Like reference numbers and designations in the various drawings indicate like elements.

DETAILED DESCRIPTION

Figure 1A:
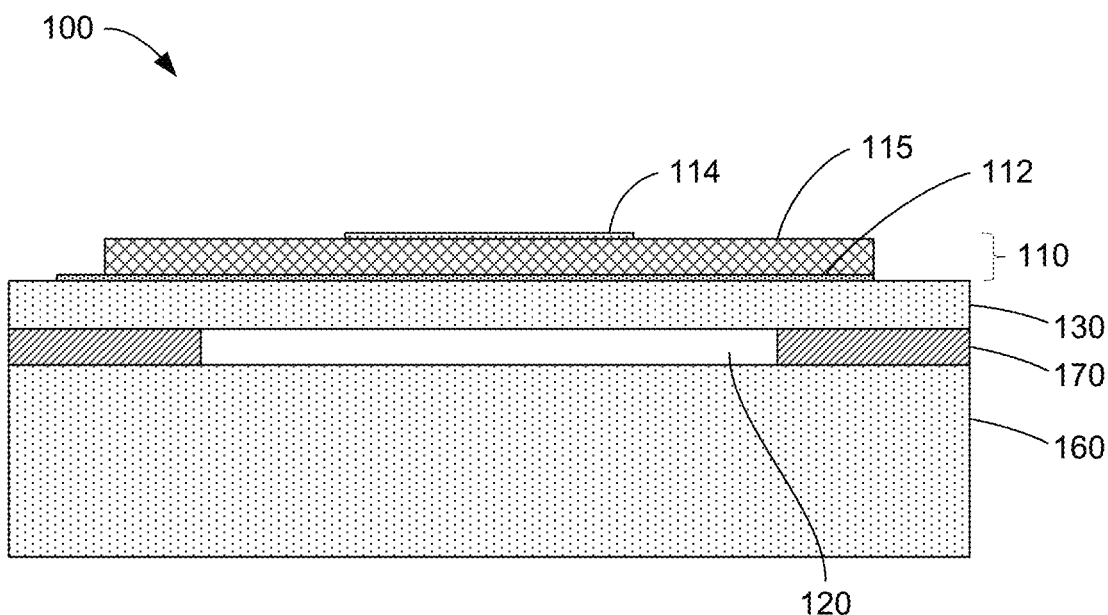
FIGS. 1A and 1B illustrate side and top views, respectively, of an example of a piezoelectric micromechanical ultrasonic transducer (PMUT) sensor element having switchable non-ultrasonic force/touch detection capability and ultrasonic imaging capability.

The following description is directed to certain implementations for the purposes of describing the innovative aspects of this disclosure. However, a person having ordinary skill in the art will readily recognize that the teachings herein may be applied in a multitude of different ways. The described implementations may be implemented in any device, apparatus, or system for ultrasonic sensing. In addition, it is contemplated that the described implementations may be included in or associated with a variety of electronic devices such as, but not limited to: mobile telephones, multimedia Internet enabled cellular telephones, mobile television receivers, wireless devices, smartphones, smart cards, wearable devices such as bracelets, armbands, wristbands, rings, headbands, patches, etc., Bluetooth® devices, personal data assistants (PDAs), wireless electronic mail receivers, hand-held or portable computers, netbooks, notebooks, smartbooks, tablet computers, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), mobile health devices, computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, automatic teller machines (ATMs), parking meters, packaging (such as in electromechanical systems (EMS) applications including microelectromechanical systems (MEMS) applications as well as non-EMS applications), aesthetic structures (such as display of images on a piece of jewelry or clothing) and a variety of EMS devices. The teachings herein also may be used in applications such as, but not limited to, electronic switching devices, radio frequency filters, sensors, accelerometers, gyroscopes, motion-sensing devices, magnetometers, inertial components for consumer electronics, parts of consumer electronics products, automobile doors, steering wheels or other automobile parts, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Implementations of the subject matter described herein relate to piezoelectric micromechanical ultrasonic transducer (PMUT) sensor elements and arrays thereof. The PMUT sensor elements may be switchable between a non-ultrasonic force detection mode and an ultrasonic imaging mode. A PMUT sensor element may include a diaphragm that is capable of a static displacement on application of a force from an object such as a finger and is capable of a dynamic displacement when the PMUT sensor element transmits or receives ultrasonic signals. In some implementations, a PMUT sensor element may include a two dimensional-electron gas structure on the diaphragm.

Implementations of the subject matter described herein also relate to sensors including an array of PMUT sensor elements. The sensors may further include a sensor controller configured to switch between a non-ultrasonic force detection mode and an ultrasonic imaging mode for one or more of the PMUT sensor elements, wherein an applied force is measured in the non-ultrasonic force detection mode and wherein an object is imaged ultrasonically during the ultrasonic imaging mode. Forces that exceed threshold force levels for wake-up and imaging may be detected and responded to accordingly.

Particular implementations of the subject matter described in this disclosure may be implemented to realize one or more of the following potential advantages. In a non-ultrasonic force detection mode, the sensors allow low-power wake-up of a device. By detecting forces that exceed a threshold force level, the sensor can be made insensitive to light, inadvertent touches with unintentional wake-up reduced. Image quality control for fingerprint imaging may be improved by using a threshold force level for imaging.

Aspects of PMUTS have been described in U.S. patent application Ser. No. 14/569,280, filed on Dec. 12, 2014 and entitled "MICROMECHANICAL ULTRASONIC TRANSDUCERS AND DISPLAY," and in U.S. patent application Ser. No. 14/569,256, filed on Dec. 12, 2014 and entitled "PIEZOELECTRIC ULTRASONIC TRANSDUCER AND PROCESS," U.S. patent application Ser. No. 14/883,583, filed on Oct. 14, 2015 and entitled "THREE-PORT PIEZOELECTRIC ULTRASONIC TRANSDUCER," U.S. patent application Ser. No. 14/883,585, filed on Oct. 14, 2015 and entitled "ACTIVE BEAM-FORMING TECHNIQUE FOR PIEZOELECTRIC ULTRASONIC TRANSDUCER ARRAY," U.S. patent application Ser. No. 14/883,586, filed on Oct. 14, 2015 and entitled "SUPERPIXEL ARRAY OF PIEZOELECTRIC ULTRASONIC TRANSDUCERS FOR 2-D BEAMFORMING," and U.S. patent application Ser. No. 15/292,057, filed Oct. 12, 2016 and entitled "INTEGRATED PIEZOELECTRIC MICROMECHANICAL ULTRASONIC TRANSDUCER PIXEL AND ARRAY," each owned by the assignee of the present invention and hereby incorporated by reference into the present application in its entirety for all purposes.

Figure 1B:
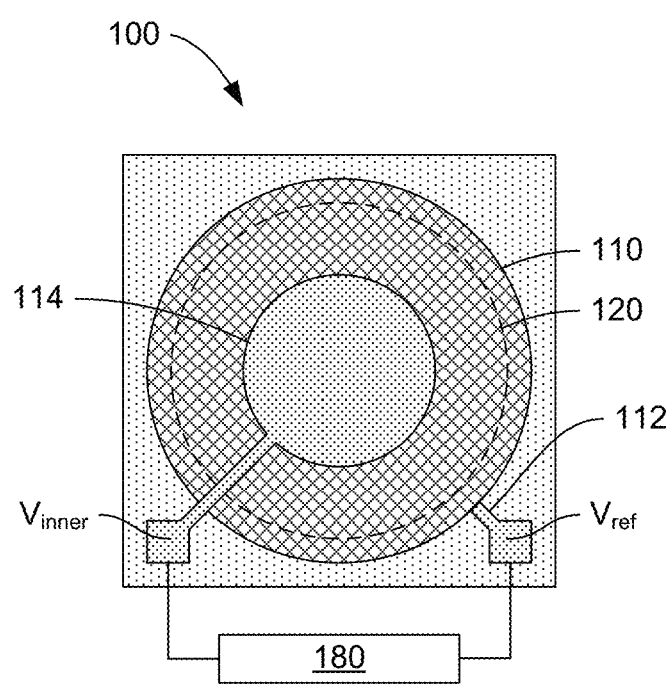

FIGS. 1A and 1B illustrate side and top views, respectively, of an example of a piezoelectric micromechanical ultrasonic transducer (PMUT) sensor element having switchable non-ultrasonic force/touch detection capability and ultrasonic imaging capability. Referring to FIG. 1A, the PMUT sensor element 100 includes a piezoelectric layer stack 110 and a mechanical layer 130 disposed to form a diaphragm (which may be referred to hereinbelow as a "PMUT diaphragm" or "deformable diaphragm") supported by an anchor structure 170 over a cavity 120. The piezoelectric layer stack 110 includes a piezoelectric layer 115, a lower electrode 112 and an upper electrode 114. The upper electrode 114 in the illustrated implementation may also be referred to as an inner electrode as it is disposed on an interior portion of the deformable diaphragm.

In the illustrated implementation, the lower electrode 112 is disposed below the piezoelectric layer 115 and proximate to the cavity 120, whereas the upper electrode 114 is disposed above the piezoelectric layer 115, proximate to a surface of the piezoelectric layer 115 that is opposite to the cavity 120. The cavity 120 may be formed in or on a substrate 160. The cavity 120 is positioned between the diaphragm and the substrate 160. In implementations in which the cavity is formed in the substrate 160, such as a cavity-silicon-on-insulator implementation, the anchor structure 170 may be part of the substrate 160.

The substrate 160 may be or include, for example, a silicon wafer, a silicon-on-insulator (SOI) wafer, a silicon or SOI wafer with integrated circuitry, a semiconductor substrate, or a glass or polymer substrate with thin film transistor (TFT) circuitry. In some implementations, the substrate 160 may be a flexible substrate such as a thin layer of polyimide (PI), polyethylene naphthalate (PEN) or polyethylene terephthalate (PET), or a flexible substrate with InGaZnO (IGZO) circuitry.

The piezoelectric layer stack may include a piezoelectric layer such as aluminum nitride (AlN), zinc oxide (ZnO), lead-zirconate titanate (PZT) or other suitable piezoelectric material with one or more electrode layers electrically coupled to the piezoelectric layer. The piezoelectric layer stack may be patterned and etched to form vias, release holes and other features. The mechanical layer may include silicon dioxide ($SiO_2$), silicon oxynitride (SiON), silicon nitride (SiN), other dielectric material, or a combination of dielectric materials or layers. In some examples, the diaphragm may be configured as an elongated rectangle having a longitudinal dimension of length L and a width W, with L being at least two times W. In some examples, the diaphragm may have a width W to thickness T ratio of between 5:1 to 50:1.

As can be seen in FIG. 1B, the PMUT sensor element 100 may have a circular geometry. The PMUT sensor element 100 is an example of a two-port PMUT, which is a PMUT having two input/output ports, one associated with lower electrode 112 and one associated with upper electrode 114. The lower electrode 112 is a reference electrode at a voltage $V_{ref}$ and the upper electrode 114 is an output/drive/sense electrode at a voltage $V_{inner}$. The transceiver circuitry 180 is schematically shown as connected to the lower electrode 112 and upper electrode 114. The transceiver circuitry 180 may be electrically coupled with the PMUT sensor element 100 by way of the two input/output ports associated with the transceiver circuitry 180.

In the example of FIGS. 1A and 1B, the upper electrode 114 may be referred to as an inner electrode. In some implementations, described further below, a three-port PMUT sensor element may have two upper electrodes, for example an inner upper electrode and an outer upper electrode with the outer electrode proximate the peripheral region of the deformable diaphragm. The PMUT sensor elements described herein are not limited to any particular geometry. Further examples of two-port and three-port PMUT sensor elements having various geometries are described below with reference to FIGS. 7A-7C and 14A-17D.

Figure 1C:
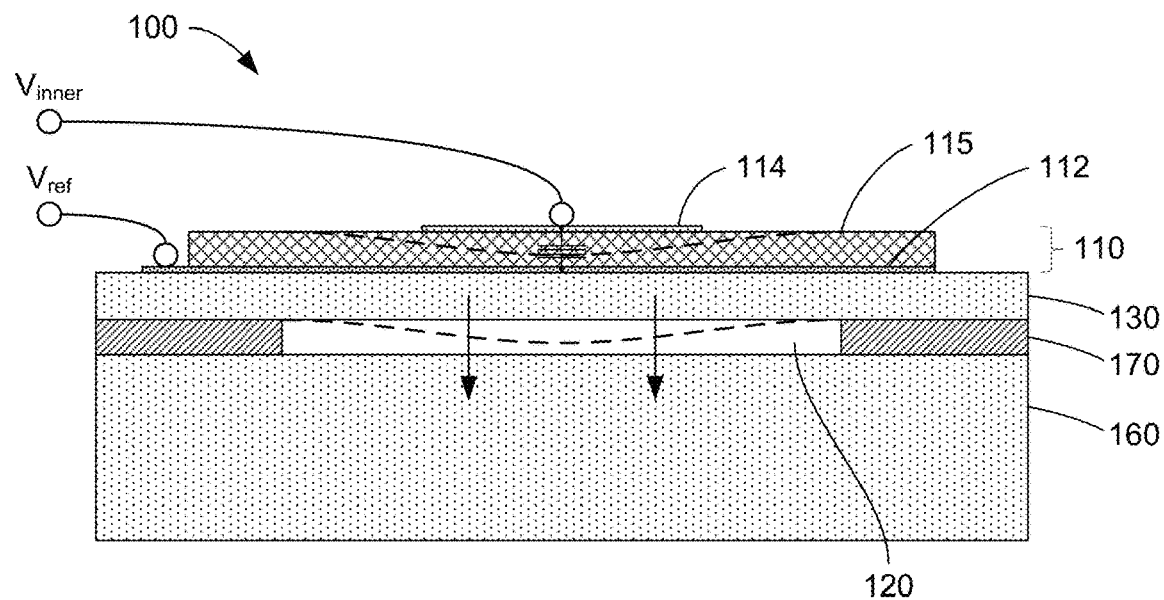
FIG. 1C illustrates a side view of an example of the PMUT sensor element shown in FIGS. 1A and 1B operating in a non-ultrasonic force/touch detection mode.
Figure 1D:
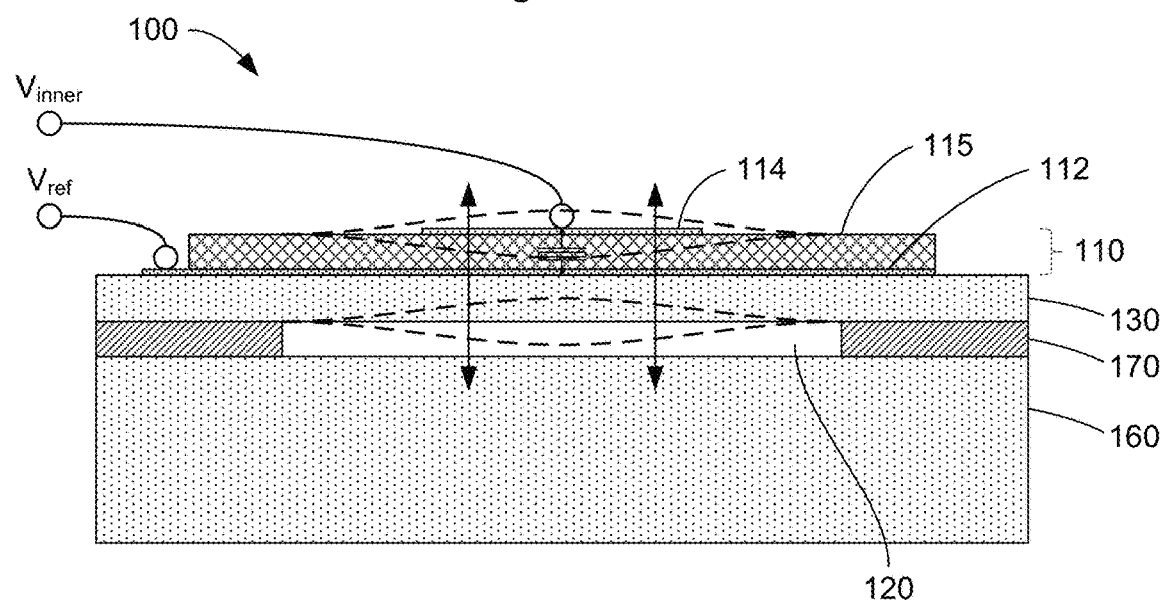
FIG. 1D illustrates a side view of an example of the PMUT sensor element shown in FIGS. 1A and 1B operating in an ultrasonic imaging mode.
Figure 1E:
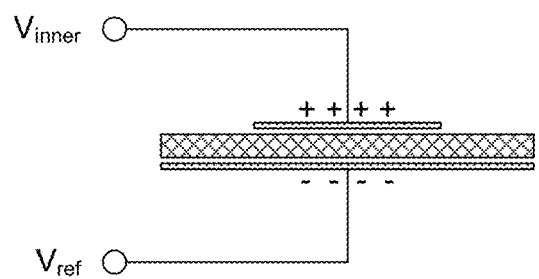
FIG. 1E is an example of a schematic of an equivalent circuit of the PMUT sensor element 100 shown in FIGS. 1C and 1D.

FIG. 1C illustrates a side view of an example of the PMUT sensor element 100 shown in FIGS. 1A and 1B operating in a non-ultrasonic force/touch detection mode. FIG. 1D illustrates a side view of an example of the PMUT sensor element 100 shown in FIGS. 1A and 1B operating in an ultrasonic imaging mode. Turning to FIG. 1C, the PMUT sensor element 100 is shown with the deformable PMUT diaphragm having a static displacement due to an applied force, as indicated by the downward directed arrows and the dashed deformed diaphragm lines. In operation, the piezoelectric layer stack 110 and the mechanical layer 130 are caused to bend in response to the applied force, which the PMUT sensor element converts to an electrical signal that may be read by the transceiver circuitry 180 shown in FIG. 1B. In implementations described herein, the force can be applied, for example, by a finger or stylus pressing on the PMUT sensor element 100 or on a platen, cover glass, or other device enclosure that overlies the PMUT sensor element 100. The output voltage $V_{inner}$ can be measured and is generally proportional to the applied force. It should be understood that while the description herein refers chiefly to force detection, the sensor elements may also be implemented for pressure detection, with pressure being the ratio of force over an area to which it is applied. Force or pressure detection allows detection of a finger touch, at least to the extent that a touch (e.g., a light touch) from a finger of a user or other object exerts a detectable force on one or more of the sensor elements. FIG. 1E is an example of a schematic of an equivalent circuit of the PMUT sensor element 100 shown in FIGS. 1C and 1D. FIG. 1E shows the electrical connections to the inner electrode and the reference electrode and the surface charge that develops on the surfaces of the piezoelectric layer when the diaphragm is deformed.

In some implementations, the deflection of the PMUT diaphragm with applied force from a finger generates a charge that may be used to power a small front-end portion of an associated controller. For example, the charge generated by the piezoelectric layer upon static deflection may be stored in a power supply capacitor that may in turn power front-end circuitry of the associated controller. The front-end portion may be used to wake up other portions of the controller or to perform a threshold detection function to avoid waking up the controller and/or an associated applications processor unless a minimum threshold force has been applied.

In some implementations, described further below with respect to FIGS. 7A-7D, the PMUT sensor element 100 may incorporate a 2-D electron gas structure such as a 2-D gas transistor. Such 2-D electron gas structures are sensitive to strain due to applied force and may be used in the static displacement, non-ultrasonic force detection mode or in a dynamic displacement mode. Sensor elements with a diaphragm and a 2-D electron gas structure disposed on the diaphragm may be used to image an object ultrasonically during an ultrasonic imaging mode.

FIG. 1D illustrates a side view of the PMUT sensor element 100 with dynamic displacements due to ultrasonic wave generation and detection. During operation, the piezoelectric layer stack 110 and the mechanical layer 130 may be caused to bend and vibrate in response to a time-varying excitation voltage applied across the upper electrode 114 and the lower electrode 112 by transceiver circuitry 180. As a result, one or more ultrasonic pressure waves having frequencies in an ultrasonic frequency band may be propagated into air, a platen, a cover glass, a device enclosure, or other propagation medium that overlies the PMUT sensor element 100. The piezoelectric layer stack 110 may likewise receive reflected ultrasonic pressure waves from an object in the propagation medium, and convert the received ultrasonic pressure waves into electrical signals that may be read by the transceiver circuitry 180. The deformable diaphragm over the cavity 120 may bend and vibrate in response to the reflected ultrasonic pressure wave impinging on a surface of the PMUT sensor element 100, generating mechanical stresses and strains in the PMUT diaphragm and generating surface charge on the surfaces of the piezoelectric layer 115 that may be detected by underlying circuitry. The PMUT diaphragm may undergo one or both of dynamic flexural motion and vibration when the PMUT transmits or receives ultrasonic signals. The deformable PMUT diaphragm having dynamic displacements in a transmit mode or a receive mode are indicated in FIG. 1D by the upward and downward directed arrows and the dashed deformed diaphragm lines. In the depicted implementation, the lower electrode 112 may be connected to a constant bias voltage $V_{ref}$ such as a ground reference potential. In some implementations the lower electrode 112 may be grounded or connected to a multi-level bias signal such as a receiver bias voltage that may be provided by the transceiver circuitry 180. The upper electrode 114 is at a drive or sense voltage ($V_{inner}$).

Figure 2:
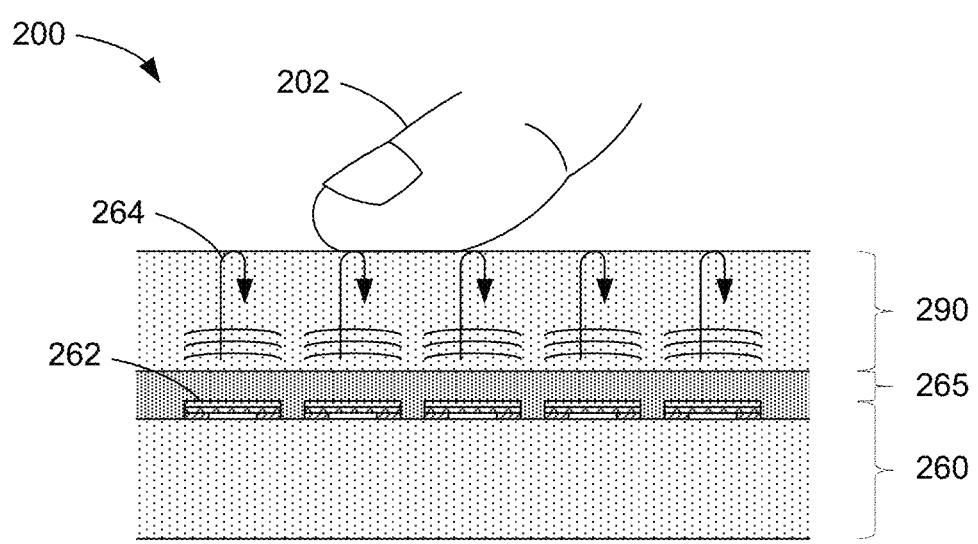
FIG. 2 illustrates a side view of an example configuration of a PMUT ultrasonic sensor array capable of ultrasonic imaging.

In some implementations, an array of PMUT sensor elements may be configured as an ultrasonic sensor array that is configured for ultrasonic fingerprint imaging. FIG. 2 illustrates a side view of an example configuration of a PMUT ultrasonic sensor array capable of ultrasonic imaging. FIG. 2 depicts an ultrasonic sensor array 200 with an array of PMUTs configured as transmitting and receiving elements that may be used for ultrasonic imaging. PMUT sensor elements 262 on a PMUT sensor array substrate 260 may emit and detect ultrasonic waves. As illustrated, an ultrasonic wave 264 may be transmitted from at one or more PMUT sensor elements 262. The ultrasonic wave 264 may travel through a propagation medium such as an acoustic coupling medium 265 and a platen 290 towards an object 202 such as a finger or a stylus positioned on an outer surface of the platen 290. A portion of the ultrasonic wave 264 may be transmitted through the platen 290 and into the object 202, while a second portion is reflected from the surface of platen 290 back towards the PMUT sensor element 262. The amplitude of the reflected wave may depend in part on the acoustic properties of the object 202 and the platen 290. The reflected wave may be detected by the PMUT sensor elements 262, from which an image of the object 202 may be acquired. For example, with sensor arrays having a pitch of about 50 microns (about 500 pixels per inch), ridges and valleys of a fingerprint may be detected. An acoustic coupling medium 265, such as an adhesive, gel, a compliant layer or other acoustic coupling material may be provided to improve coupling between an array of PMUT sensor elements 262 disposed on the sensor array substrate 260 and the platen 290. The acoustic coupling medium 265 may aid in the transmission of ultrasonic waves to and from the PMUT sensor elements 262. The platen 290 may include, for example, a layer of glass, plastic, sapphire, metal, metal alloy, or other platen material. An acoustic impedance matching layer (not shown) may be disposed on an outer surface of the platen 290. The platen 290 may include a coating (not shown) on the outer surface. In some implementations, PMUT sensor elements may be co-fabricated with thin-film transistor (TFT) circuitry or CMOS circuitry on or in the same substrate, which may be a silicon, SOI, glass or plastic substrate, in some examples. The TFT, silicon or semiconductor substrate may include row and column addressing electronics, multiplexers, local amplification stages and control circuitry.

Figure 3A:
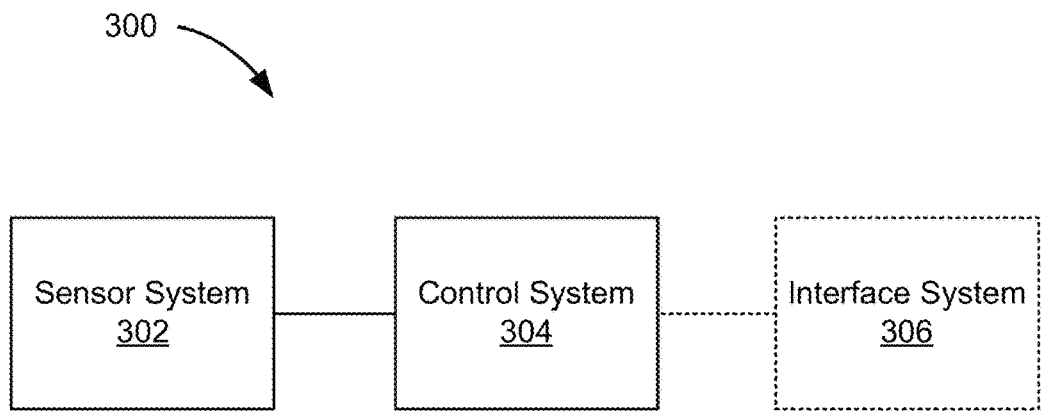
FIG. 3A shows a block diagram representation of components of an example sensing system 300 according to some implementations.

An ultrasonic sensor array may be part of a sensing system of a device, for example, a mobile device. FIG. 3A shows a block diagram representation of components of an example sensing system 300 according to some implementations. As shown, the sensing system 300 may include a sensor system 302 and a control system 304 electrically coupled to the sensor system 302. The sensor system 302 may be capable of detecting the presence of an object, for example a human finger. The sensor system 302 may be capable of scanning an object and providing raw measured image information usable to obtain an object signature, for example, a fingerprint of a human finger. The control system 304 may be capable of controlling the sensor system 302 and processing the raw measured image information received from the sensor system. In some implementations, the sensing system 300 may include an interface system 306 capable of transmitting or receiving data, such as raw or processed measured image information, to or from various components within or integrated with the sensing system 300 or, in some implementations, to or from various components, devices or other systems external to the sensing system.

Figure 3B:
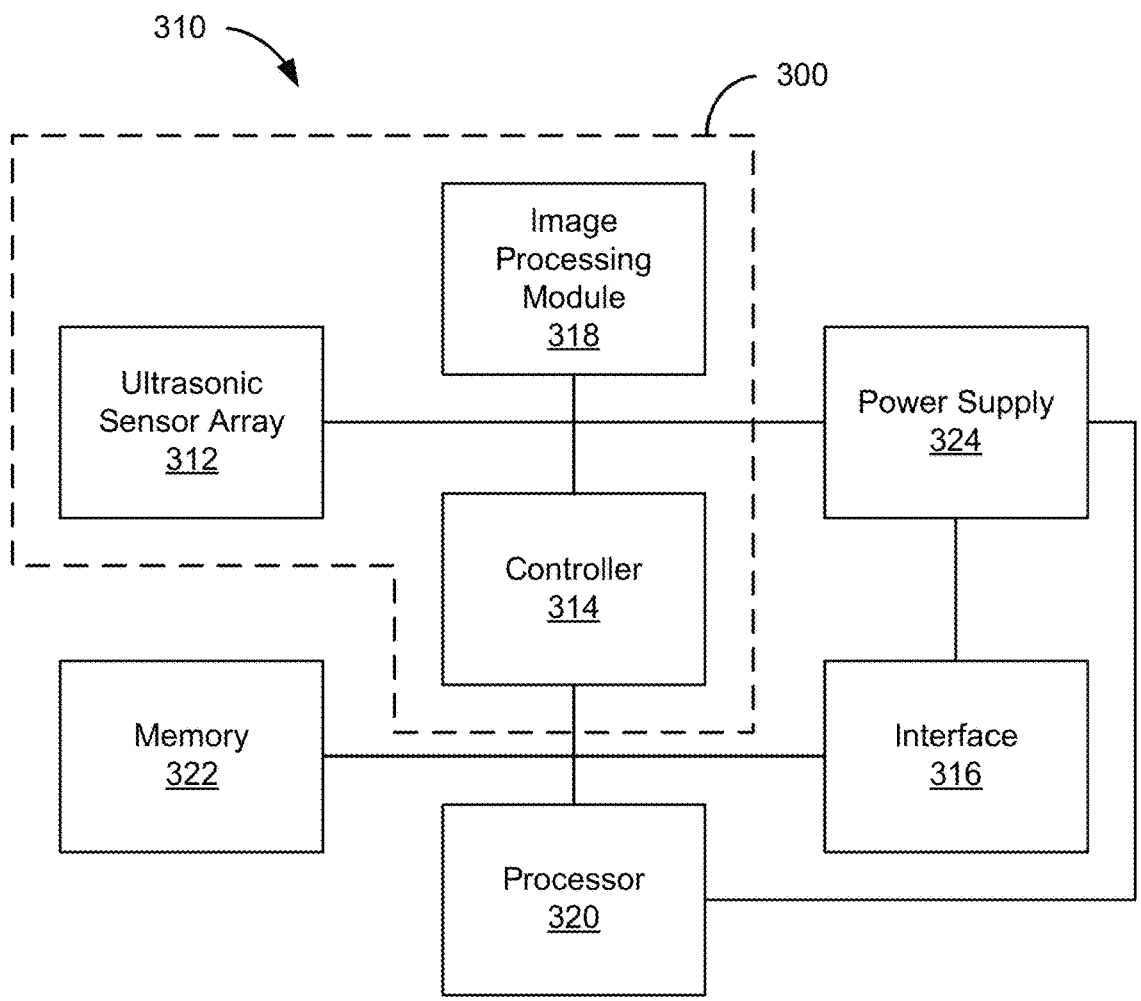
FIG. 3B shows a block diagram representation of components of an example mobile device that includes the sensing system of FIG. 3A.

FIG. 3B shows a block diagram representation of components of an example mobile device 310 that includes the sensing system 300 of FIG. 3A. The sensor system 302 of the sensing system 300 of the mobile device 310 may be implemented with an ultrasonic sensor array 312, such as the PMUT ultrasonic sensor array 200 shown in FIG. 2. The control system 304 of the sensing system 300 may be implemented with a controller 314 that is electrically coupled to the ultrasonic sensor array 312. While the controller 314 is shown and described as a single component, in some implementations, the controller 314 may collectively refer to two or more distinct control units or processing units in electrical communication with one another. In some implementations, the controller 314 may include one or more of a general purpose single- or multi-chip processor, a central processing unit (CPU), a digital signal processor (DSP), an applications processor, an application specific integrated circuit (ASIC), a field programmable gate array (FPGA) or other programmable logic device (PLD), discrete gate or transistor logic, discrete hardware components, or any combination thereof designed to perform the functions and operations described herein.

The sensing system 300 of FIG. 3B may include an image processing module 318. In some implementations, raw measured image information provided by the ultrasonic sensor array 312 may be sent, transmitted, communicated or otherwise provided to the image processing module 318. The image processing module 318 may include any suitable combination of hardware, firmware and software configured, adapted or otherwise operable to process the image information provided by the ultrasonic sensor array 312. In some implementations, the image processing module 318 may include signal or image processing circuits or circuit components including, for example, amplifiers (such as instrumentation amplifiers or buffer amplifiers), analog or digital mixers or multipliers, switches, analog-to-digital converters (ADCs), passive or active analog filters, among others. In some implementations, one or more of such circuits or circuit components may be integrated within the controller 314, for example, where the controller 314 is implemented as a system-on-chip (SoC) or a system-in-package (SIP). In some implementations, one or more of such circuits or circuit components may be integrated within a DSP included within or coupled to the controller 314. In some implementations, the image processing module 318 may be implemented at least partially via software. For example, one or more functions of, or operations performed by, one or more of the circuits or circuit components just described may instead be performed by one or more software modules executing, for example, in a processing unit of the controller 314 (such as in a general purpose processor or a DSP).

In some implementations, in addition to the sensing system 300, the mobile device 310 may include a separate processor 320 such as an applications processor, a memory 322, an interface 316 and a power supply 324. In some implementations, the controller 314 of the sensing system 300 may control the ultrasonic sensor array 312 and the image processing module 318, and the processor 320 of the mobile device 310 may control other components of the mobile device 310. In some implementations, the processor 320 may communicate data to the controller 314 including, for example, instructions or commands. In some such implementations, the controller 314 may communicate data to the processor 320 including, for example, raw or processed image information. It should also be understood that, in some other implementations, the functionality of the controller 314 may be implemented entirely, or at least partially, by the processor 320. In some such implementations, a separate controller 314 for the sensing system 300 may not be required because the functions of the controller 314 may be performed by the processor 320 of the mobile device 310.

Depending on the implementation, one or both of the controller 314 and processor 320 may store data in the memory 322. For example, the data stored in the memory 322 may include raw measured image information, filtered or otherwise processed image information, estimated PSF or estimated image information, and final refined PSF or final refined image information. The memory 322 may store processor-executable code or other executable computer-readable instructions capable of execution by one or both of the controller 314 and the processor 320 to perform various operations (or to cause other components such as the ultrasonic sensor array 312, the image processing module 318, or other modules to perform operations), including any of the calculations, computations, estimations or other determinations described herein (including those presented in any of the equations below). It should also be understood that the memory 322 may collectively refer to one or more memory devices (or "components"). For example, depending on the implementation, the controller 314 may have access to and store data in a different memory device than the processor 320. In some implementations, one or more of the memory components may be implemented as a NOR- or NAND-based Flash memory array. In some other implementations, one or more of the memory components may be implemented as a different type of non-volatile memory. Additionally, in some implementations, one or more of the memory components may include a volatile memory array such as, for example, a type of RAM.

In some implementations, the controller 314 or the processor 320 may communicate data stored in the memory 322 or data received directly from the image processing module 318 through an interface 316. For example, such communicated data can include image information or data derived or otherwise determined from image information. The interface 316 may collectively refer to one or more interfaces of one or more various types. In some implementations, the interface 316 may include a memory interface for receiving data from or storing data to an external memory such as a removable memory device. Additionally or alternatively, the interface 316 may include one or more wireless network interfaces or one or more wired network interfaces enabling the transfer of raw or processed data to, as well as the reception of data from, an external computing device, system or server.

A power supply 324 may provide power to some or all of the components in the mobile device 310. The power supply 324 may include one or more of a variety of energy storage devices. For example, the power supply 324 may include a rechargeable battery, such as a nickel-cadmium battery or a lithium-ion battery. Additionally or alternatively, the power supply 324 may include one or more supercapacitors. In some implementations, the power supply 324 may be chargeable (or "rechargeable") using power accessed from, for example, a wall socket (or "outlet") or a photovoltaic device (or "solar cell" or "solar cell array") integrated with the mobile device 310. Additionally or alternatively, the power supply 324 may be wirelessly chargeable.

As used hereinafter, the term "processing unit" refers to any combination of one or more of a controller of an ultrasonic system (for example, the controller 314), an image processing module (for example, the image processing module 318), or a separate processor of a device that includes the ultrasonic system (for example, the processor 320). In other words, operations that are described below as being performed by or using a processing unit may be performed by one or more of a controller of the ultrasonic system, an image processing module, or a separate processor of a device that includes the sensing system.

Figure 4A:
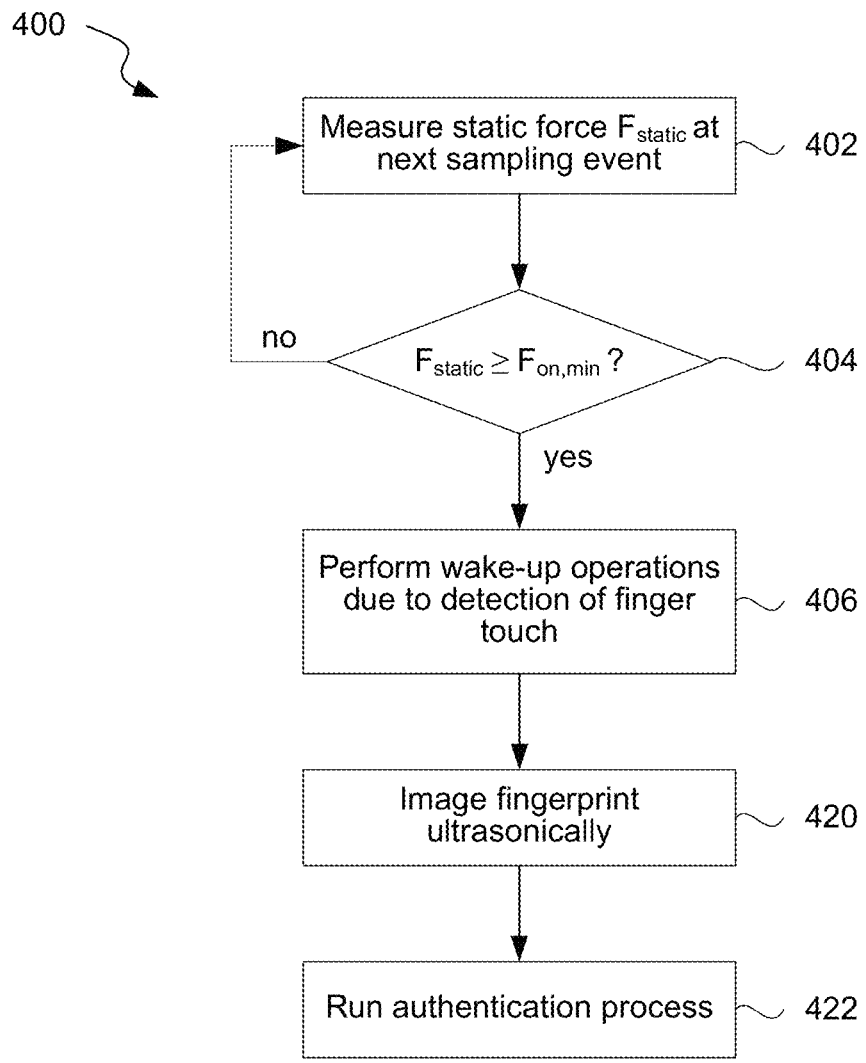
FIG. 4A shows an example of a flow diagram illustrating a process for force/touch detection, fingerprint imaging, and authentication using a sensor system including an ultrasonic sensor array according to certain implementations.

As described above, the ultrasonic sensor array may be configured to operate in a static, non-ultrasonic mode to detect the force of a finger or other object pressing on the sensor. Once the presence of a finger is detected, the fingerprint may be imaged ultrasonically by the sensor and a user authenticated. FIG. 4A shows an example of a flow diagram illustrating a process 400 for force/touch detection, fingerprint imaging, and authentication using a sensor system including an ultrasonic sensor array according to certain implementations. It should be noted with respect to FIG. 4A, as well as with respect to FIG. 4B below, that functions that are run independently of force/touch detection (e.g., background routines or applications) are not shown for clarity.

The process 400 begins at block 402 with measuring the static force $F_{static}$ at the next sampling event. Example sampling rates may range from less than about 5 events per second to 20 events per second or more. The static force may be measured for one or more sensor elements in the ultrasonic sensor array as described above with respect to FIG. 1C for a single PMUT sensor element. The process 400 continues at a decision block 404 where the measured static force $F_{static}$ is compared to an on-threshold force level, $F_{on,min}$. In one example, the on-threshold level may be 20 gram-force (gf). However, it is understood that the on-threshold level may depend on a particular sensor, device, and/or user. In some implementations, a user-specific on-threshold level may be determined during an enrollment process. If the measured static force is less than the on-threshold level, the process 400 returns to block 402. If the measured static force is greater than or equal to the on-threshold level, a finger touch is detected and a pressed-finger condition may be entered. The pressed-finger condition may be entered when the measured finger force exceeds the on-threshold level, also referred to as the pressed-finger threshold level. The process 400 then continues at block 406 with performing wake-up operations due to the detection of the finger touch. For example, referring back to FIG. 3B, the processor 320 may be activated from a sleep mode or off state by the controller 314. In some implementations, a controller or applications processor may also turn on a display. In some implementations, entering the pressed-finger condition may include waking up at least a portion of the mobile device (such as a portion of the applications processor or a portion of the display) when the measured finger force exceeds the pressed-finger threshold. The process then continues at block 420 with imaging the fingerprint ultrasonically. Block 420 may be performed as described above with respect to FIG. 1D and FIG. 2. The process 400 continues at block 422 with running an authentication process. Block 422 may involve determining if the fingerprint imaged in block 420 belongs to an enrolled user.

Figure 4B:
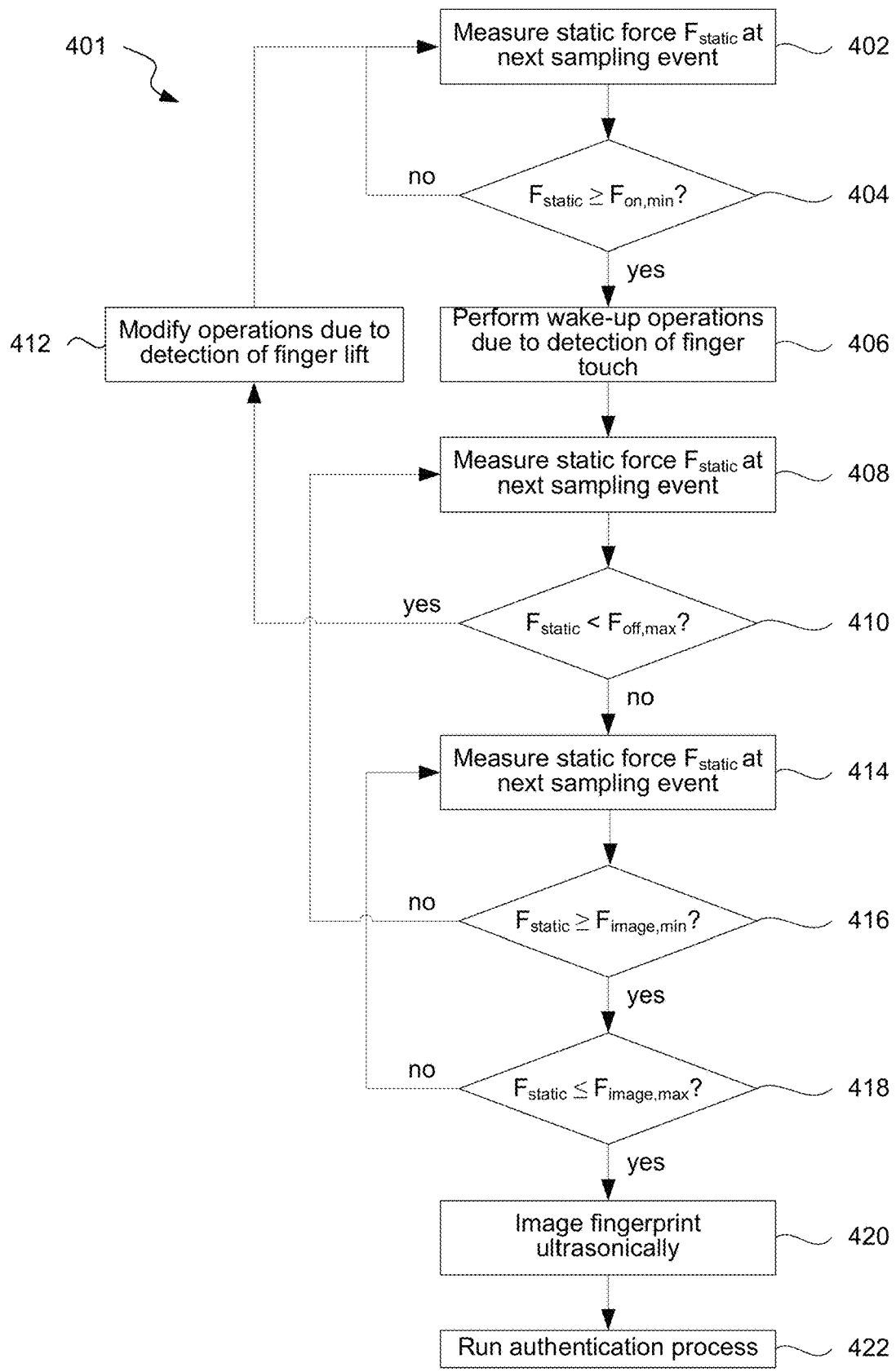
FIG. 4B shows an example of a flow diagram illustrating a process for force/touch detection, finger-lift detection, fingerprint imaging, and authentication using a sensor system including an ultrasonic sensor array.

In some implementations, the sensor may detect when a finger is lifted from the sensor and modify operations of a mobile device accordingly. FIG. 4B shows an example of a flow diagram illustrating a process 401 for force/touch detection, finger-lift detection, fingerprint imaging, and authentication using a sensor system including an ultrasonic sensor array as described herein.

The process 401 begins with blocks 402, 404, and 406 performed as described above with respect to FIG. 4A. After a minimum-force finger touch is detected and one or more wake-up operations are activated or otherwise performed at block 406, the process 401 continues at block 408 with measuring the static force. The sampling rate for block 408 may be the same or different as for block 402. The process 401 continues at a decision block 410 where the measured static force $F_{static}$ is compared to an off-threshold force level, $F_{off,max}$. The off-threshold level is typically less than the on-threshold level. In one example, an off-threshold level may be 10 gf or 10 gf less than the on-threshold level. However, it is understood that an off-threshold level may depend on the particular sensor, device, and/or enrolled user. In some implementations, a user-specific off-threshold level may be determined during an enrollment process. If the measured static force is less than the off-threshold level, a finger lift is detected and a lifted-finger condition may be entered. The lifted-finger condition may be entered when the measured finger force is less than the off-threshold level, also referred to as the lifted-finger threshold level. The process 401 then continues at block 412 with modifying operations due to detection of the finger lift, such as reducing the sampling rate at which the static finger force is measured. The process may then return to block 402. If the measured static force is not less than the off-threshold level, the process 401 continues at block 414 with measuring the static force at the next sampling event. The sampling rate for block 414 may be the same or different as for block 402 or block 408. The process 401 continues at a decision block 416 where the measured static force $F_{static}$ is compared to a minimum imaging threshold force level, $F_{image,min}$. The minimum imaging threshold level may the minimum force at which ultrasonic imaging of a fingerprint can be performed to obtain an image sufficiently accurate and detailed for authentication. If the static force is less than the minimum imaging threshold level, the process may return to block 408 to determine whether a finger has been lifted.

If the static force measured at block 416 is greater or equal to the minimum imaging threshold level, the process 401 continues at a decision block 418 where the measured static force $F_{static}$ is compared to a maximum imaging threshold level, $F_{image,max}$. The maximum imaging threshold level may be the maximum force at which ultrasonic imaging of a fingerprint can be performed to obtain an image sufficiently accurate and detailed for authentication. If the static force is greater than the maximum imaging threshold level, the process may return to block 414 and a maximum imageable-finger condition may be entered. The maximum imageable-finger condition may be entered when the measured finger force is greater than the maximum imaging threshold level, also referred to as the maximum imageable-finger threshold level. If the static force is less than or equal to the maximum imaging threshold level and the static force is greater than the minimum imaging threshold level, the process 401 may enter an imageable-finger condition and continues with ultrasonic fingerprint imaging at block 420 and running an authentication process at block 422, as described above with respect to FIG. 4A. The imageable-finger condition may be entered when the measured finger force is greater than the minimum imaging threshold level, also referred to as the minimum imageable-finger threshold level. In some implementations, the imageable-finger condition may be entered when the measured finger force is greater than the minimum imageable-finger threshold level and less than the maximum imageable-finger threshold level. In some implementations, the minimum imageable-finger threshold level may be equal to or greater than the pressed-finger threshold level.

In one example, a minimum imaging threshold level may be 40 gf and a maximum imaging threshold level may be 80 gf. However, it is understood that these threshold levels may depend on the particular sensor, device and/or user. In some implementations, user-specific imaging threshold levels may be determined during an enrollment process. In some implementations, there may not be a maximum imaging threshold level with the process 401 proceeding directly from block 416 to block 420.

In some implementations, an enrollment process is performed in which an applied finger force is measured. A range of images at different forces may be stored as part of the enrollment process, e.g., image 1 at 40 gf, image 2 at 50 gf, etc., and the measured finger force may be stored as part of one or more enrollment templates that include the associated fingerprint image information. During a subsequent authentication process, the force of the imaged finger may be compared to the stored finger force of the enrollment templates using a force-ranked comparison method. For example, if a fingerprint is imaged at a finger force of 50 gf, an enrollment template having a finger force at or near 50 gf may be used first during the authentication process in an attempt to verify that the user is an enrolled user.

Figure 5A:
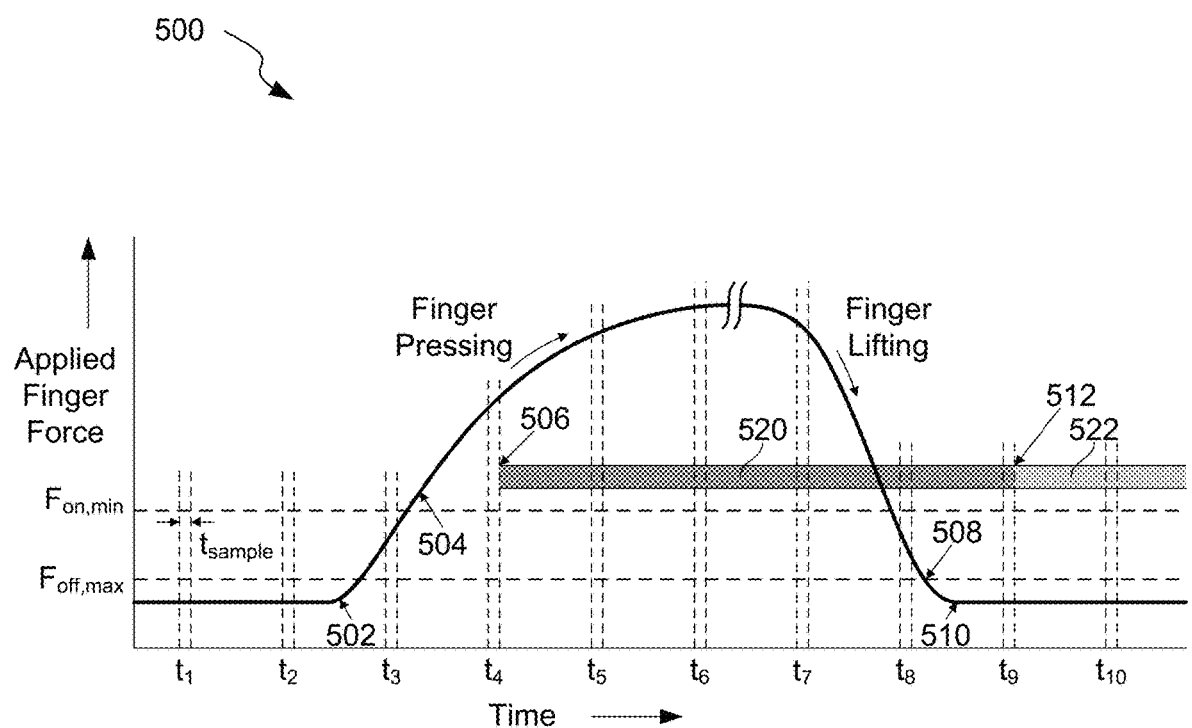
FIG. 5A is an example of a diagram illustrating applied finger force versus time for finger-touch detection and finger-lift detection events of a fingerprint sensor operating in a non-ultrasonic force detection mode.

FIG. 5A is an example of a diagram 500 illustrating applied finger force versus time for finger-touch detection and finger-lift detection events of a fingerprint sensor operating in a non-ultrasonic force detection mode. Ten sampling events, $t_1$-$t_{10}$ are shown, each having a duration of $t_{sample}$. The on-threshold level, $F_{on,min}$ and the off-threshold level, $F_{off,max}$ are indicated on the y-axis. At 502, between sampling events $t_2$ and $t_3$, a finger begins to touch the fingerprint sensor. At 504, as the finger continues pressing, the applied finger force is greater than the on-threshold level, $F_{on,min}$. Then, at 506, the applied finger force is measured to be greater than the on-threshold level, $F_{on,min}$, indicating a minimum-force touch detection, which initializes wake-up operations and may send a wake-up signal to an applications processor to activate one or more wake-up operations. Wake-up and continued operations 520 of the device, which may include performing imaging and authentication operations, are performed. Between $t_6$ and $t_7$, the finger begins to lift. At 508, the applied finger force is less than the off-threshold level $F_{off,max}$. The finger is lifted off the device at 510, which is detected at 512, the next sampling event. Continuing operations 522 may be performed, such as sampling in a non-ultrasonic force detection mode and running background applications. In some implementations, the pressed-finger condition may be entered at 506 when the measured finger force exceeds the pressed-finger threshold level ($F_{on,min}$). The lifted-finger condition may be entered when the applied finger force is measured and determined at 512 to be less than the lifted-finger threshold level ($F_{off,max}$).

Figure 5B:
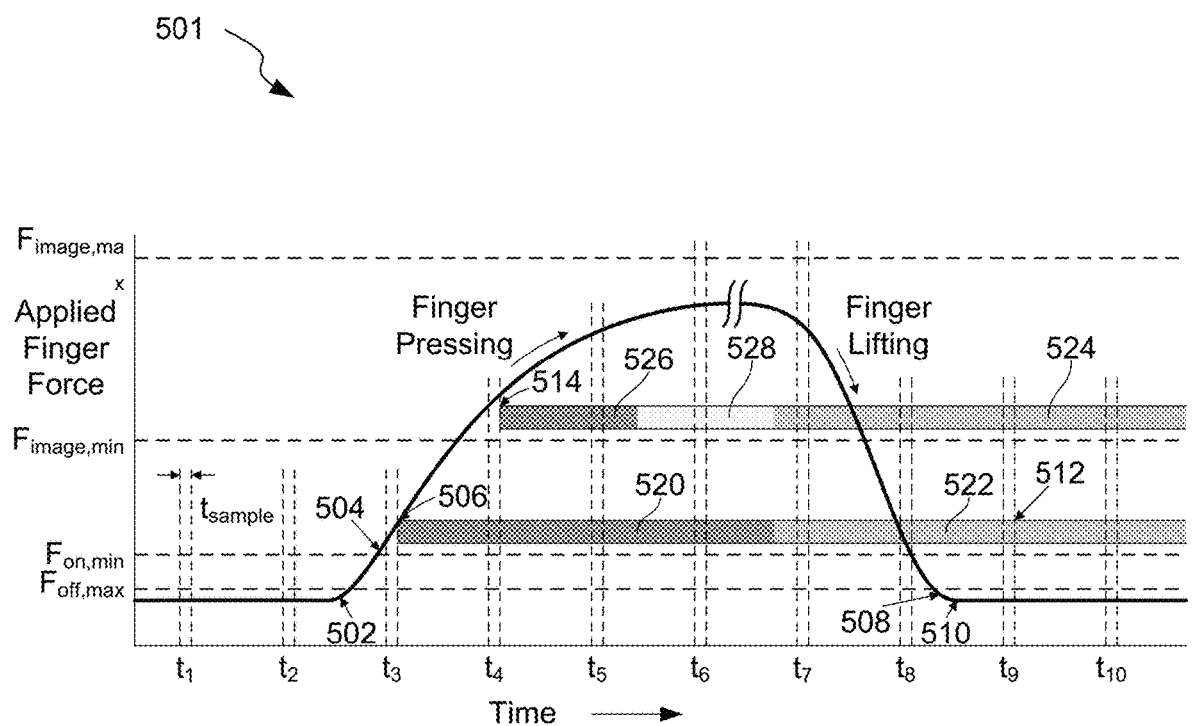
FIG. 5B is an example of a diagram illustrating applied finger force versus time for imaging performed by a fingerprint sensor operating in an ultrasonic imaging mode.

FIG. 5B is an example of a diagram 501 illustrating applied finger force versus time for imaging performed by a fingerprint sensor operating in an ultrasonic imaging mode. The events 502-512 related to finger-touch detection and finger-lift detection, as described above with respect to FIG. 5A, are shown on the diagram 501, although it should be noted that some occur at different sampling events than in the example of FIG. 5A.

The minimum imaging threshold level, $F_{image,min}$ and maximum imaging threshold level, $F_{image,max}$ are indicated on the y-axis. In the example of FIG. 5B, at 514, the applied finger force is measured to be greater than the minimum imaging threshold level, $F_{image,min}$. This initializes an image acquisition operation 526 with the fingerprint sensor operating in the ultrasonic imaging mode to acquire or obtain ultrasonic images and/or fingerprint image information of the finger. An authentication process 528 is then performed. Continued operations 524 may then be performed. If the fingerprint is authenticated, continued operations 524 may include running various applications on a mobile device. In the example of FIG. 5B, continuing operations 522 such as sampling in a non-ultrasonic force detection mode may continue during the continued operations 524, however, in some implementations, sampling in the non-ultrasonic force detection mode may not continue if the device is being actively used after authentication. In some implementations, an imageable-finger condition may be entered at 514, with the finger imaged when the measured finger force exceeds the minimum imageable-finger threshold level ($F_{image,min}$) and, in some implementations, is also less than the maximum imageable-finger threshold level ($F_{image,max}$).

Figure 6:
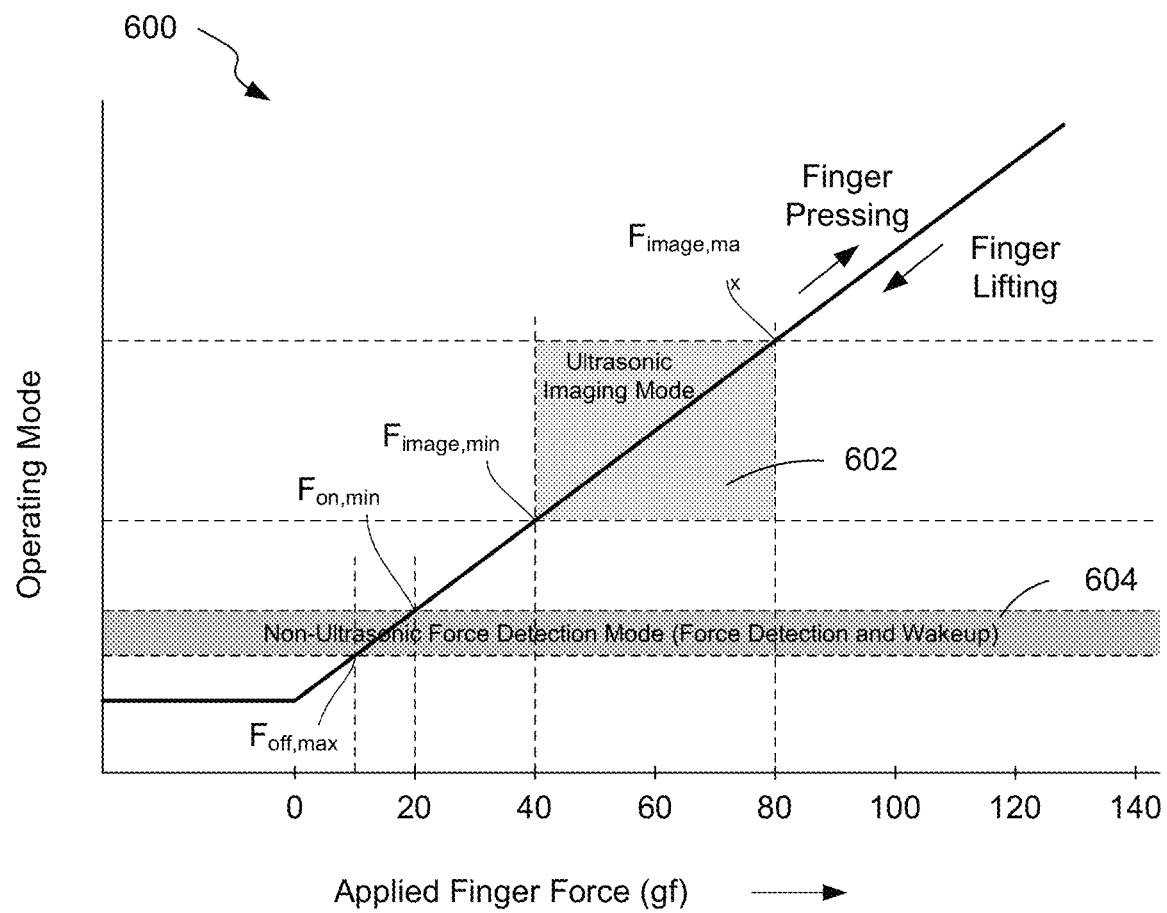
FIG. 6 is an example of a diagram illustrating a non-ultrasonic force/touch detection mode and an ultrasonic imaging mode of a fingerprint sensor versus applied finger force.

FIG. 6 is an example of a diagram 600 illustrating a non-ultrasonic force/touch detection mode and an ultrasonic imaging mode of a fingerprint sensor versus applied finger force. The on-threshold level $F_{on,min}$, the off-threshold level $F_{off,max}$, the minimum imaging threshold level $F_{image,min}$, and the maximum imaging threshold level $F_{image,max}$ are indicated. It should be noted that the threshold levels associated with the applied force are illustrative. In the scenario shown, a minimum of 20 gf ($F_{on,min}$) is needed for minimum-force finger-touch detection and less than 10 gf ($F_{off,max}$) for finger-lift detection. A minimum of 40 gf ($F_{image,min}$) is needed for fingerprint imaging. Beyond 80 gf of applied force ($F_{image,max}$), imaging may be halted. However, as described above with respect to FIGS. 4A and 4B, these threshold levels may vary based on one or more of the particular sensor system, device, or user.

In the example of FIG. 6, the fingerprint sensor may be in an ultrasonic image mode 602 only when the applied finger force is between 40 gf and 80 gf, the minimum and maximum imaging threshold levels, respectively. As indicated above with respect to FIG. 4B, in some implementations, there may not be a maximum imaging threshold level. Also, in the example of FIG. 6, the non-ultrasonic force/touch detection mode 604 may be implemented at all applied finger forces. It should be noted that between 40 gf and 80 gf, the fingerprint sensor may either be in ultrasonic imaging mode 602 or in non-ultrasonic force detection mode 604. For example, if a fingerprint has not been imaged or authenticated, the ultrasonic imaging mode may be activated when the applied finger force is measured to be within 40 gf and 80 gf. However, if a fingerprint has already been authenticated and the device is in use, the fingerprint sensor may be in the non-ultrasonic detection mode in this applied finger force range to determine, for example, whether the finger has been lifted or not. As indicated above, in some implementations, the non-ultrasonic detection mode may be employed only when the device is in a sleep mode or otherwise off.

In some implementations, a PMUT sensor element may include a two-dimensional (2-D) electron gas structure such as a 2-D gas transistor that is strain-sensitive. A 2-D electron gas structure may be disposed on or fabricated with a diaphragm of a PMUT sensor element. A non-ultrasonic force detection mode may employ a static displacement signal from the 2-D electron gas structure indicating a degree of strain due to a static displacement of the diaphragm and that corresponds to the applied force. Examples of 2-D electron gas (e.g., "two-dimensional electron gas" or "2DEG") structures that may be employed include high electron mobility transistor (HEMT) structures. In a particular example, aluminum gallium nitride/gallium nitride (AlGaN/GaN) heterostructures including AlGaN/GaN transistors and AlGaN/GaN Schottky diodes may be employed.

Figure 7A:
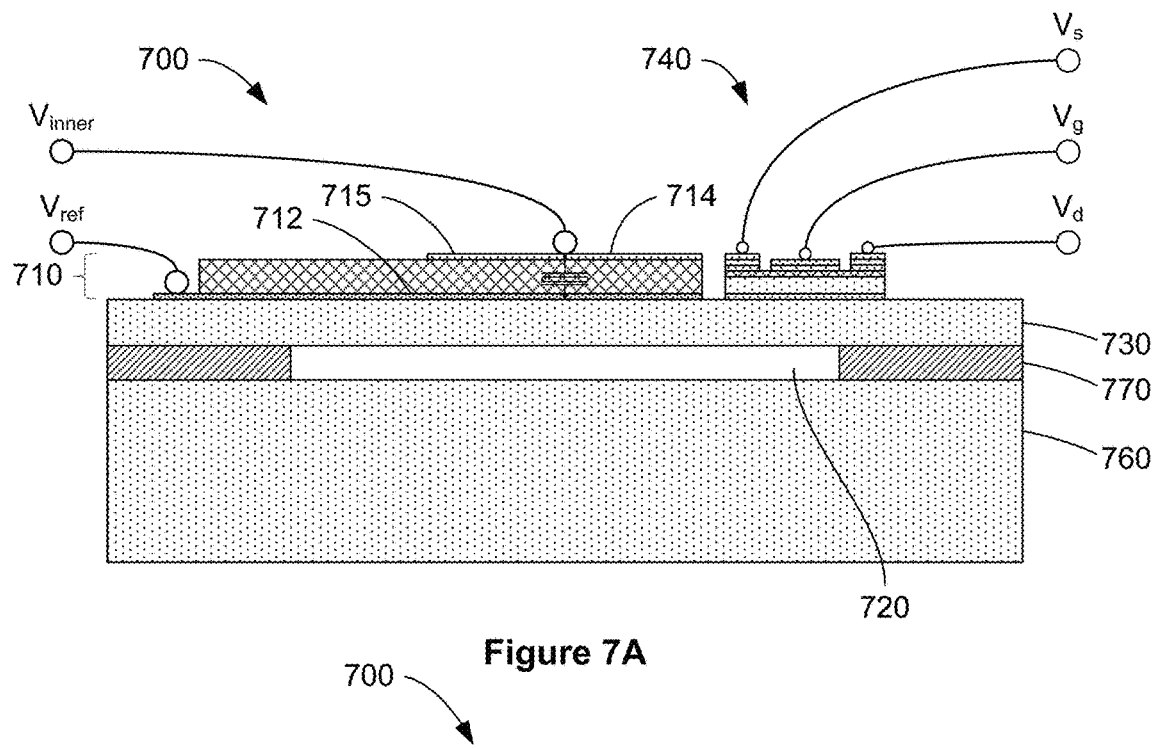
FIGS. 7A-7C illustrate an example of a PMUT sensor element that includes a 2-D electron gas structure.
Figure 7B:
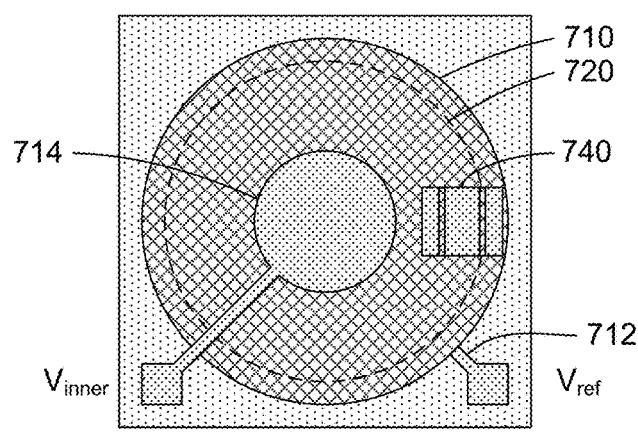
Figure 7C:
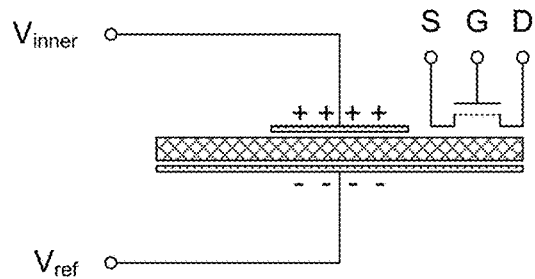

FIGS. 7A-7C illustrate an example of a PMUT sensor element 700 that includes a 2-D electron gas structure. FIG. 7A illustrates a side view of the PMUT sensor element; FIG. 7B illustrates a top view of the PMUT sensor element; and FIG. 7C is a schematic of an equivalent circuit of the PMUT sensor element 700 shown in FIGS. 7A and 7B.

Figure 7D:
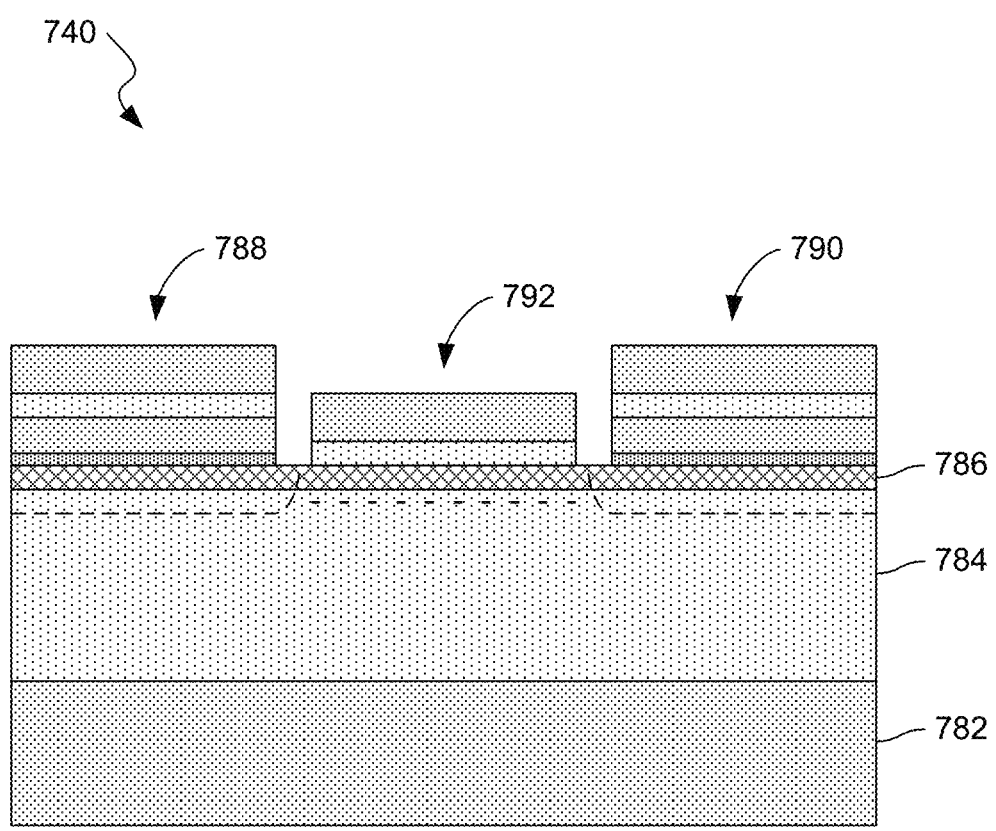
FIG. 7D illustrates a side view of an example of a 2-D electron gas structure that may be implemented with or without the PMUT sensor elements described herein.

The PMUT sensor element 700 is similar to that depicted in FIGS. 1A-1D, with the addition of a 2-D electron gas structure 740, which is formed on an outer region of the mechanical layer 730 of the PMUT diaphragm. An enlarged view of an example of a 2-D electron gas structure 740 is shown in FIG. 7D. The PMUT diaphragm includes a piezoelectric layer stack 710 and a mechanical layer 730 supported by an anchor structure 770 over a cavity 720. The cavity 720 may be formed in or on a substrate 760.

The piezoelectric layer stack 710 includes a piezoelectric layer 715, a lower electrode 712 and an upper electrode 714. The upper electrode 714 in the illustrated implementation may also be referred to as an inner electrode as it is disposed over an interior portion of the deformable diaphragm.

An equivalent circuit of the PMUT sensor element 700 is shown in FIG. 7C. Each of the terminals depicted may be connected to transceiver circuitry, with the 2-D electron gas structure used during the non-ultrasonic force detection mode and/or in the ultrasonic imaging mode. The strain-sensitive 2-D electron gas structure may be used for detecting vibrations or other dynamic deformations instead of or in addition to detecting static deflections. For example, in some implementations, the piezoelectric layer stack 710 may be configured to excite the diaphragm and generate ultrasonic waves while the 2-D electron gas structure serves as a receiver element to detect reflected ultrasonic waves. In such implementations, the upper electrode 714 may be configured as a drive electrode and the 2-D electron gas structure 740 may be configured as a sense electrode. Similarly, in some implementations, the upper electrode 714 may be configured as a sense electrode and the 2-D electron gas structure 740 configure as a drive electrode.

FIG. 7D illustrates a side view of an example of a 2-D electron gas structure 740 that may be implemented with or without the PMUT sensor elements described herein. In the example of FIG. 7D, the 2-D electron gas structure 740 is an AlGaN/GaN transistor that includes a GaN buffer layer 782, a GaN body layer 784, an AlGaN gate dielectric layer 786, a source (S) stack 788, a drain (D) stack 790, and a gate (G) stack 792. In one example, the source stack 788 and the drain stack 790 may be titanium/aluminum/nickel/gold (Ti/Al/Ni/Au) stacks and the gate stack 792 may be a Ni/Au stack. A passivation layer (not shown) such as silicon nitride (SiN) or other appropriate dielectric material may be conformally deposited over the 2-D electron gas structure 740. Metal interconnects (not shown) provide connections between the source stack 788, the drain stack 790, the gate stack 792, and appropriate controller circuitry.

The 2-D electron gas structure 740 may be formed on the mechanical layer 730 of a PMUT sensor element 700 by standard thin-film processing techniques such as metal-organic chemical vapor deposition (MOCVD) or molecular beam epitaxy (MBE) deposition, lithographic patterning and etching. In some implementations, a 2-D electron gas structure may be fabricated during fabrication of the mechanical layer of a PMUT sensor element, forming an integral part of the mechanical layer.

In some implementations, a 2-D electron gas structure may be formed on or with a diaphragm that is not an ultrasonic transducer to form a non-ultrasonic sensor element. Structurally, such a sensor element may be similar to that shown in FIG. 7A, including the 2-D electron gas structure 740 on a mechanical layer 730 that is suspended over a cavity 720. A piezoelectric layer stack 710 may or may not be present. As discussed further below, a non-ultrasonic sensor element including a 2-D electron gas structure on a diaphragm may be incorporated into an ultrasonic sensor array that includes PMUT sensor elements. In some implementations, a non-ultrasonic sensor element including a 2-D electron gas structure on a diaphragm or other structure such as a cantilevered beam may be incorporated into any appropriate sensor array or otherwise used to provide highly sensitive force detection.

FIGS. 8-13 illustrate examples of various configurations of ultrasonic sensor arrays that are configured to switch between a non-ultrasonic force detection mode and an ultrasonic imaging mode. In some implementations, only a subset of PMUT sensor elements in an array of PMUT sensor elements are used for force detection in the non-ultrasonic force detection mode. This is because, in some implementations, accurate force measurements may be obtained using only a subset of the PMUT sensor elements.

Figure 8:
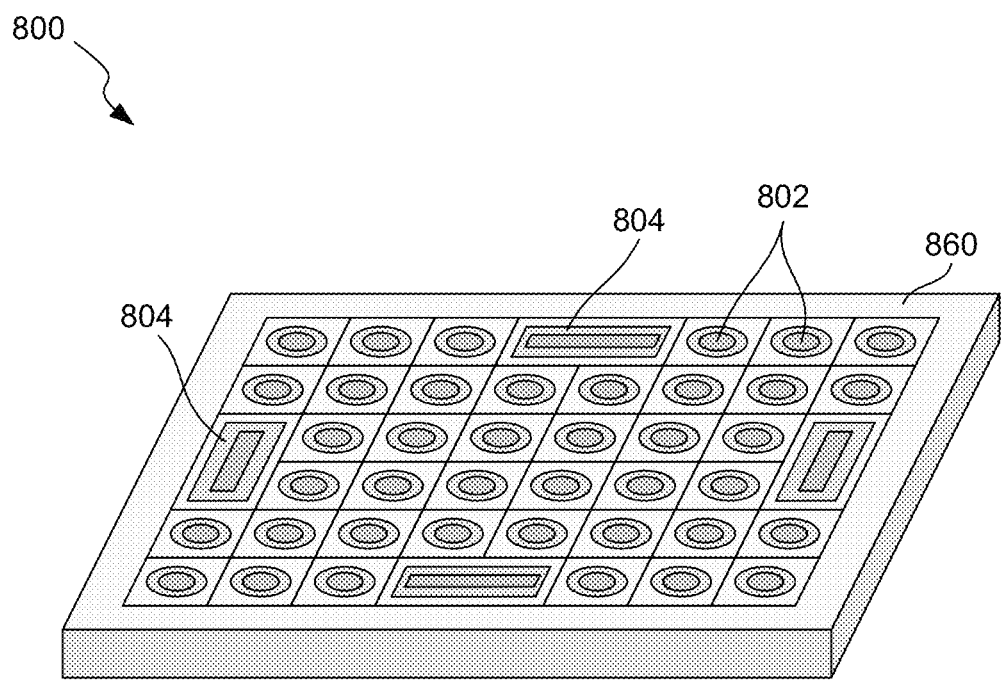
FIGS. 8-13 illustrate examples of various configurations of ultrasonic sensor arrays that are configured to switch between a non-ultrasonic force detection mode and an ultrasonic imaging mode.

FIG. 8 illustrates an example of an ultrasonic sensor array 800 including PMUT sensor elements 802 and PMUT sensor elements 804 formed on a substrate 860. The PMUT sensor elements 802 are shown as circular PMUT sensor elements. Examples of circular PMUT sensor elements are described with reference to FIGS. 1A-1D, above, and with reference to FIGS. 14A-14C, below. It will be understood that these PMUT sensor elements may be any appropriate shape. In some implementations, the PMUT sensor elements 802 are not used for force detection in the non-ultrasonic force detection mode. PMUT sensor elements 804 are larger than the PMUT sensor elements 802 and are shown as rectangular. Examples of rectangular PMUT sensor elements are described below with reference to FIGS. 15A-15C and FIGS. 16A-16C. It will be understood that these PMUT sensor elements may be any appropriate shape and size. In some implementations, the PMUT sensor elements 804 that are used for non-ultrasonic force detection may be larger than the PMUT sensor elements 802 that are used solely for ultrasonic imaging. The PMUT sensor elements 804, used during non-ultrasonic force detection mode to detect applied force as described above, are located on the periphery of the ultrasonic sensor array 800. By placing the PMUT sensor elements 804 used for force detection around the periphery, the ultrasonic sensor array may be used for centering detection. While only the PMUT sensor elements 804 are used for non-ultrasonic force detection, both PMUT sensor elements 802 and PMUT sensor elements 804 may be used for ultrasonic imaging as described above with respect to FIG. 2. That is, the PMUT sensor elements 804 may initially be used to statically detect force from a finger press and then be switched to an ultrasonic mode for ultrasonic imaging in some implementations. In alternative implementations, the PMUT sensor elements 804 may be used only for force detection, with only the PMUT sensor elements 802 used for ultrasonic imaging. In some implementations, PMUT sensor elements 804 near the periphery of the ultrasonic sensor array 800 may be used for cursor, pointer or icon control, or for screen navigation on a display of a mobile device.

Figure 9:
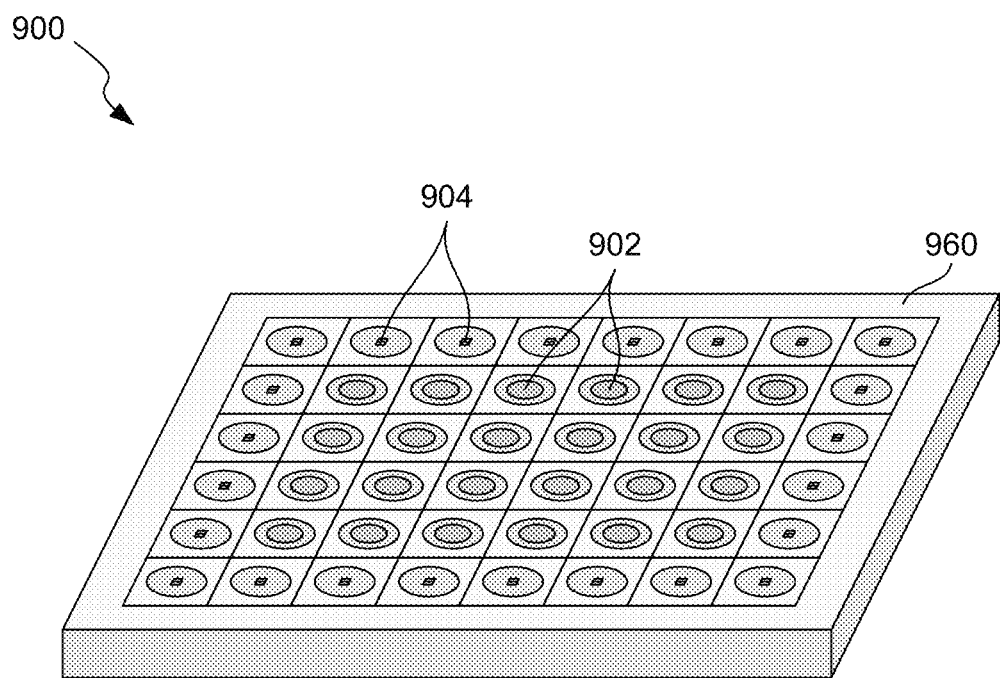

FIG. 9 illustrates an example of an ultrasonic sensor array 900 including PMUT sensor elements 902 and PMUT sensor elements 904 formed on a substrate 960. The PMUT sensor elements 904, which are on the periphery of the array forming the outermost edge of the array, may be used exclusively for non-ultrasonic force detection or for both non-ultrasonic force detection and ultrasonic imaging. The PMUT sensor elements 902, located in the interior of the array, may be used for ultrasonic imaging and may or may not be used for non-ultrasonic force detection in some implementations.

In some implementations, the PMUT sensor elements 904 include 2-D electron gas structures for force detection. In some implementations, the sensor elements 904 may include piezoelectric layer stacks, 2-D electron gas structures, or both piezoelectric layer stacks and 2-D electron gas structures. Examples of PMUT sensor elements that include 2-D electron gas structures are described above with respect to FIGS. 7A-7D and further below with respect to FIGS.

17A-17C. In implementations in which the PMUT sensor elements 902 are not used for force detection, sensor elements 902 may or may not include 2-D electron gas structures. In implementations where the PMUT sensor elements 904 are used for non-ultrasonic force detection, both PMUT sensor elements 902 and PMUT sensor elements 904 may be used for ultrasonic imaging. In some implementations, the PMUT sensor elements 904, with or without 2-D electron gas structures, may be used for cursor control, screen navigation, and control purposes.

Figure 10:
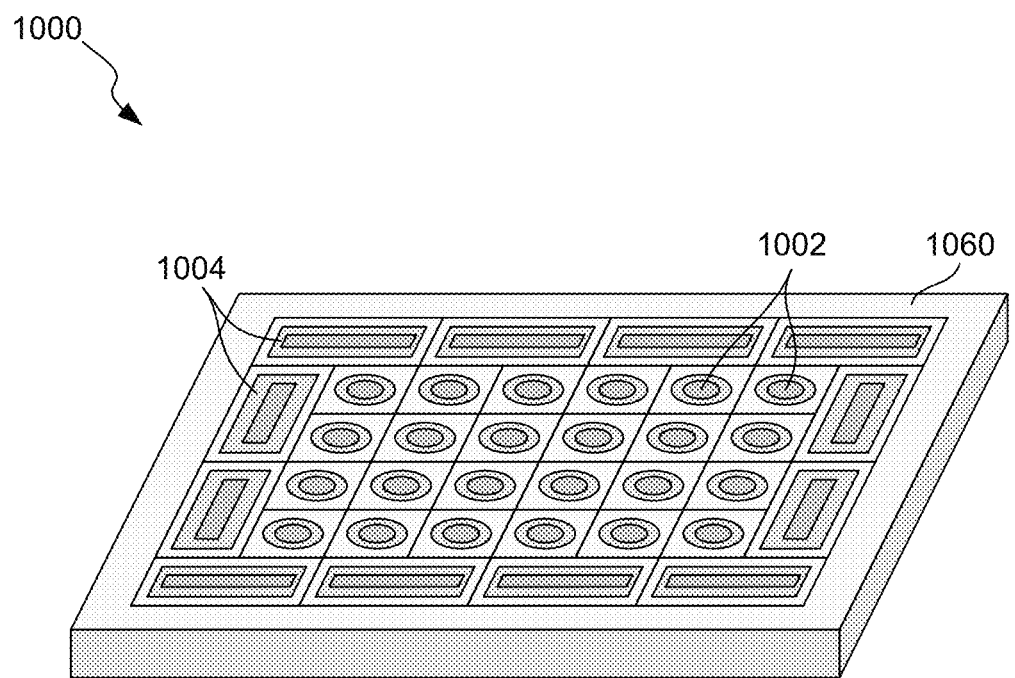

FIG. 10 illustrates an example of an ultrasonic sensor array 1000 including PMUT sensor elements 1002 and PMUT sensor elements 1004 formed on a substrate 1060. The PMUT sensor elements 1004, which are located on the periphery of the array and form the outermost edge of the array, may be used for either or both non-ultrasonic force detection and ultrasonic imaging. The PMUT sensor elements 1002, located in the interior of the array, may be used for ultrasonic imaging and not for non-ultrasonic force detection in some implementations. As in FIG. 8, the PMUT sensor elements 1004 are rectangular and larger than the PMUT sensor elements 1002. The PMUT sensor elements 1004 may be used, in some implementations, for cursor control, screen navigation, and control purposes.

Figure 11:
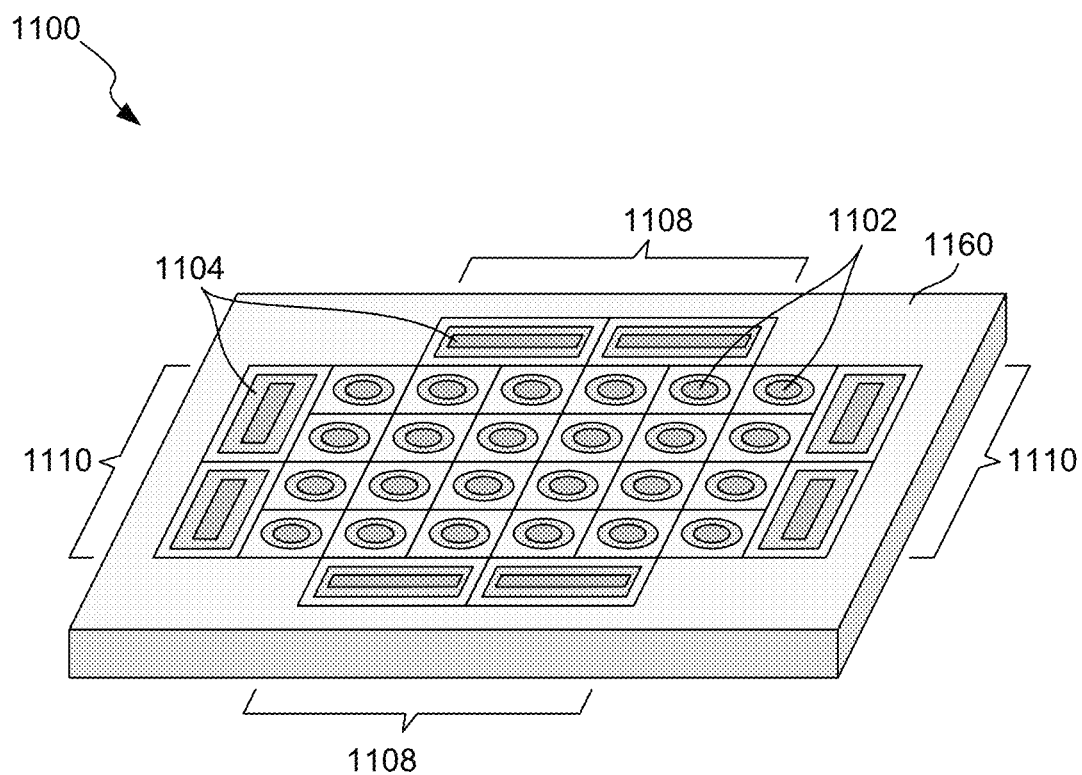

FIG. 11 illustrates an example of an ultrasonic sensor array 1100 including PMUT sensor elements 1102 and sensor elements 1104 formed on a substrate 1160. The sensor elements 1104, which are located on the periphery of the array and form the outermost edge of the array, may be used for non-ultrasonic force detection and may or may not be used for ultrasonic imaging. The PMUT sensor elements 1102, located in the interior of the array, may be used for ultrasonic imaging and may or may not be used for non-ultrasonic force detection in some implementations. As in FIG. 8, the PMUT sensor elements 1004 are rectangular and larger than the PMUT sensor elements 1002. In the example of FIG. 11, the sensor elements 1104 may provide x- and y-cursor or pointer control, with sensor elements 1110 providing x-cursor or x-pointer control and sensor elements 1108 providing y-cursor or y-pointer control.

Figure 12:
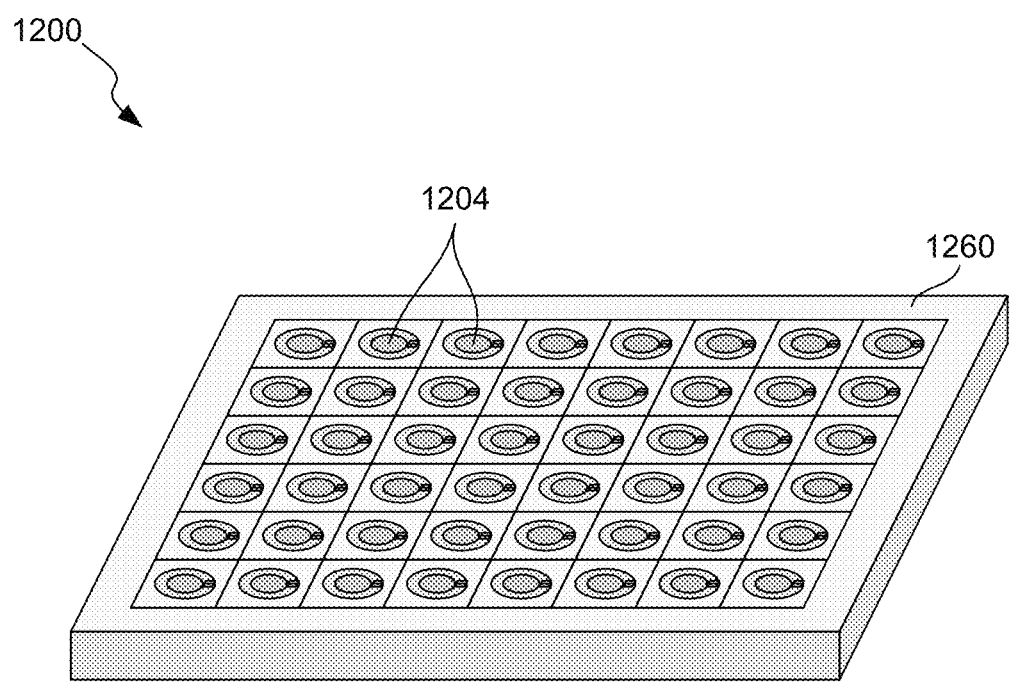

FIG. 12 illustrates an example of an ultrasonic sensor array 1200 including PMUT sensor elements 1204 formed on a substrate 1260. In the example of FIG. 12, a subset or all of the PMUT sensor elements 1204 in the array may be used for both non-ultrasonic force detection and ultrasonic imaging. In some implementations, the PMUT sensor elements 1204 may include 2-D electron gas structures as described, for example, with FIGS. 7A-7D and 17A-17C along with piezoelectric layer stacks. In some implementations, the PMUT sensor elements 1204 may not include 2-D electron gas structures as described, for example, with reference to FIGS. 1A-1E, FIGS. 14A-C, FIGS. 15A-15C, and FIGS. 16A-16C.

Figure 13:
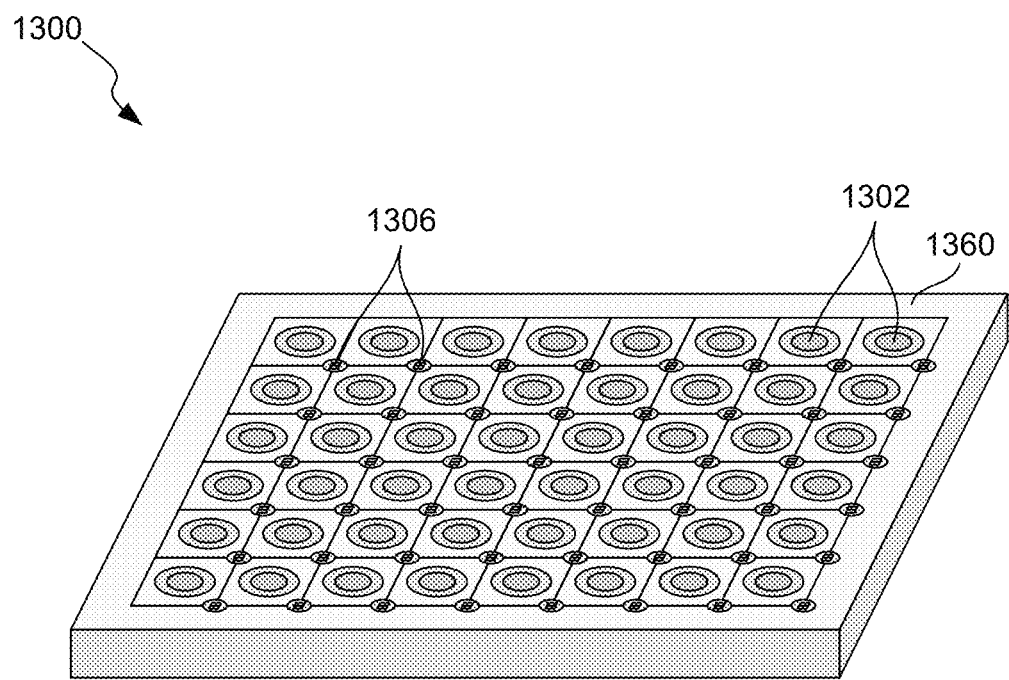

As indicated above, in some implementations, a 2-D electron gas structure may be formed on or with a diaphragm that does not serve as an ultrasonic transducer to form a non-ultrasonic sensor element. FIG. 13 illustrates an example of an ultrasonic sensor array 1300 including PMUT sensor elements 1302 formed on a substrate 1360 and non-ultrasonic force sensor elements 1306 that include 2-D electron gas structures on diaphragms. In some implementations, each PMUT sensor element 1302 in the ultrasonic sensor array 1300 may have a corresponding non-ultrasonic force sensor element 1306 in close proximity. In some implementations such as shown in FIG. 13, each sensor element 1302 may include a piezoelectric layer stack and each sensor element 1306 may include a 2-D electron gas structure.

The ultrasonic sensor arrays depicted in FIGS. 8-13 may be configured as a home button of a mobile device or as a standalone fingerprint sensor. Still further, they may be implemented on three-dimensional (3-D) mice and haptic devices.

Figure 14A:
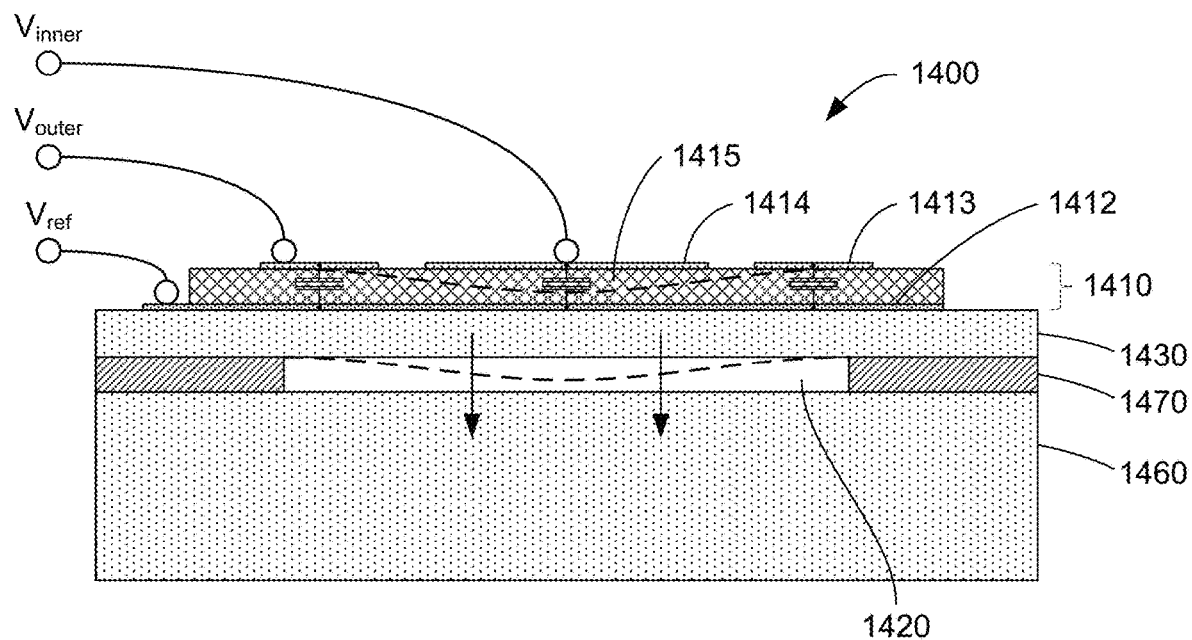
FIGS. 14A-17D illustrate examples of PMUT sensor elements that may be implemented in ultrasonic sensor arrays according to various implementations.

FIGS. 14A-17D illustrate examples of PMUT sensor elements that may be implemented in an ultrasonic sensor array according to various implementations. FIGS. 14A and 14B illustrate side views of an example of a three-port PMUT sensor element 1400 operating in a non-ultrasonic force detection mode and ultrasonic imaging mode, respectively. FIG. 14C shows a top view of the PMUT sensor element 1400 shown in FIGS. 14A and 14B. FIG. 14D shows an equivalent circuit for the PMUT sensor element shown in FIGS. 14A and 14B. The PMUT sensor element 1400 includes a piezoelectric layer stack 1410 and a mechanical layer 1430 disposed so as to form a deformable diaphragm supported by an anchor structure 1470 over a cavity 1420. The cavity 1420 may be formed in or on a substrate 1460. The piezoelectric layer stack 1410 includes a piezoelectric layer 1415, a lower electrode 1412 and two upper electrodes: an inner electrode 1414 and outer electrode 1413.

In the illustrated implementation, the inner electrode 1414, the outer electrode 1413, and the lower electrode 1412 may be electrically coupled with transceiver circuitry and may function as separate electrodes providing signal transmission, signal reception, and a common reference or ground. This arrangement allows timing of transmit (Tx) and receive (Rx) signals to be independent of each other. More particularly, the illustrated arrangement enables substantially simultaneous transmission and reception of signals between the piezoelectric ultrasonic transducer (PMUT) sensor element 1400 and the transceiver circuitry.

FIG. 14A is a side view of the PMUT sensor element 1400 with static displacement due to an applied force. As described above with respect to FIG. 1C, in operation, the piezoelectric layer stack 1410 and the mechanical layer 1430 may be caused to bend in response to an applied force, which the PMUT sensor element converts to an electrical signal that may be read by the transceiver circuitry.

Figure 14B:
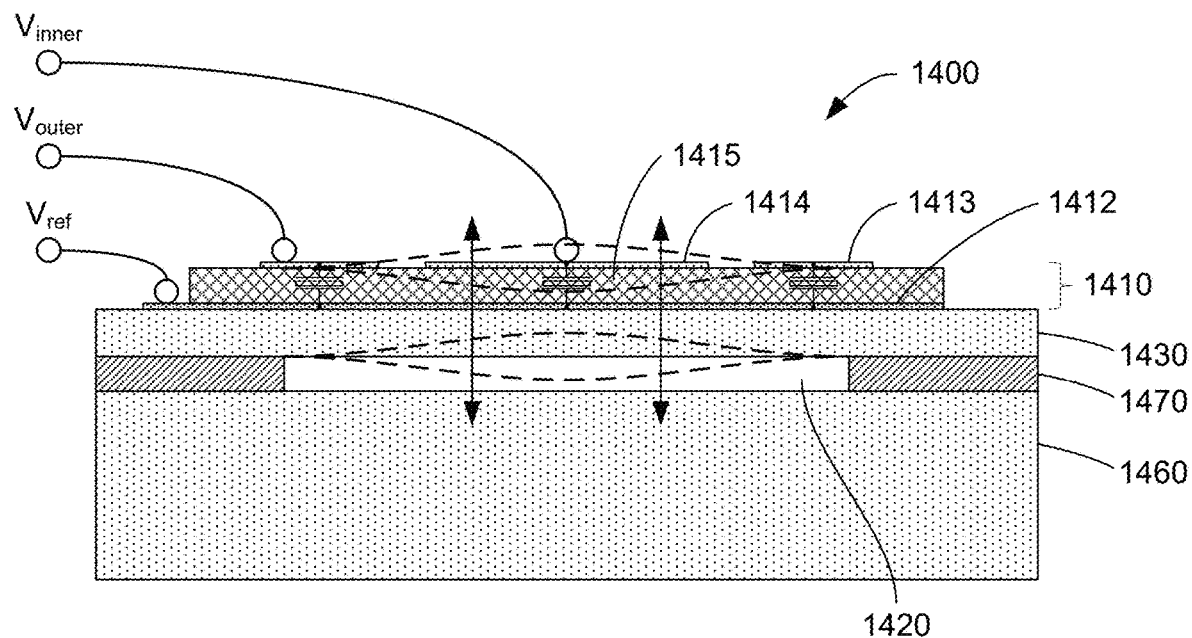
Figure 14C:
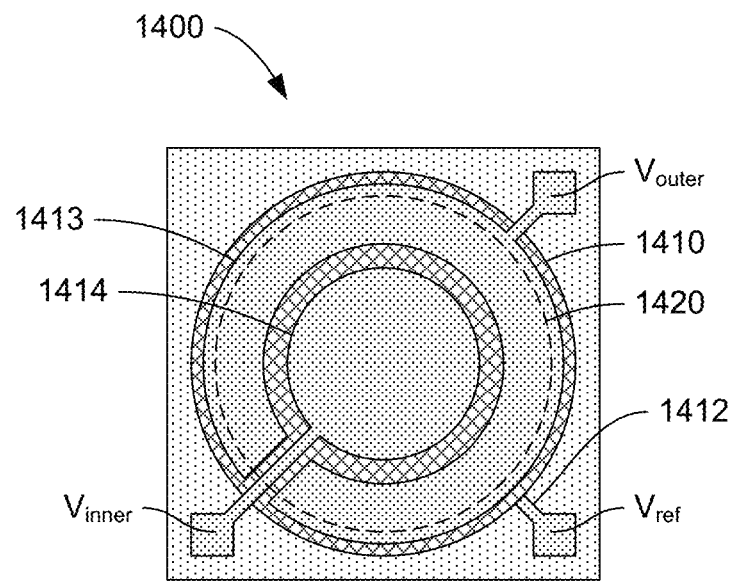
Figure 14D:
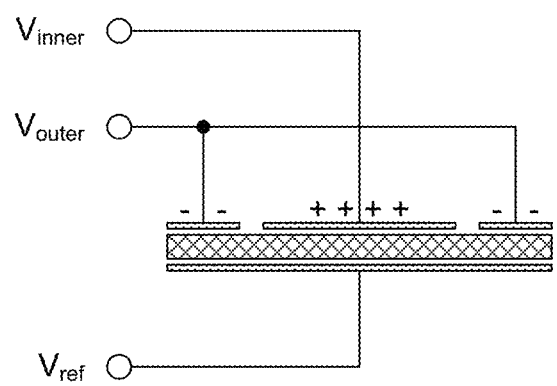

FIG. 14B is a side view of the PMUT sensor element 1400 with dynamic displacement due to ultrasonic wave generation and detection. As described above with respect to FIG. 1D, during operation in an ultrasonic imaging mode, the piezoelectric layer stack 1410 and the mechanical layer 1430 may be caused to bend and vibrate in response to a time-varying excitation voltage applied across the inner electrode 1414 and/or outer electrode 1413 by transceiver circuitry. As a result, one or more ultrasonic pressure waves having frequencies in an ultrasonic frequency band may be propagated into air, a platen, a cover glass, a device enclosure, or other propagation medium that overlies the PMUT sensor element 1400. The piezoelectric layer stack 140 may likewise receive reflected ultrasonic pressure waves from an object in the propagation medium, and convert the received ultrasonic pressure waves into electrical signals that may be read by transceiver circuitry.

The PMUT sensor elements may have various geometries, including but not limited to circular and rectangular geometries. In some embodiments, an ultrasonic array may include PMUT sensor elements having different geometries.

Figure 15A:
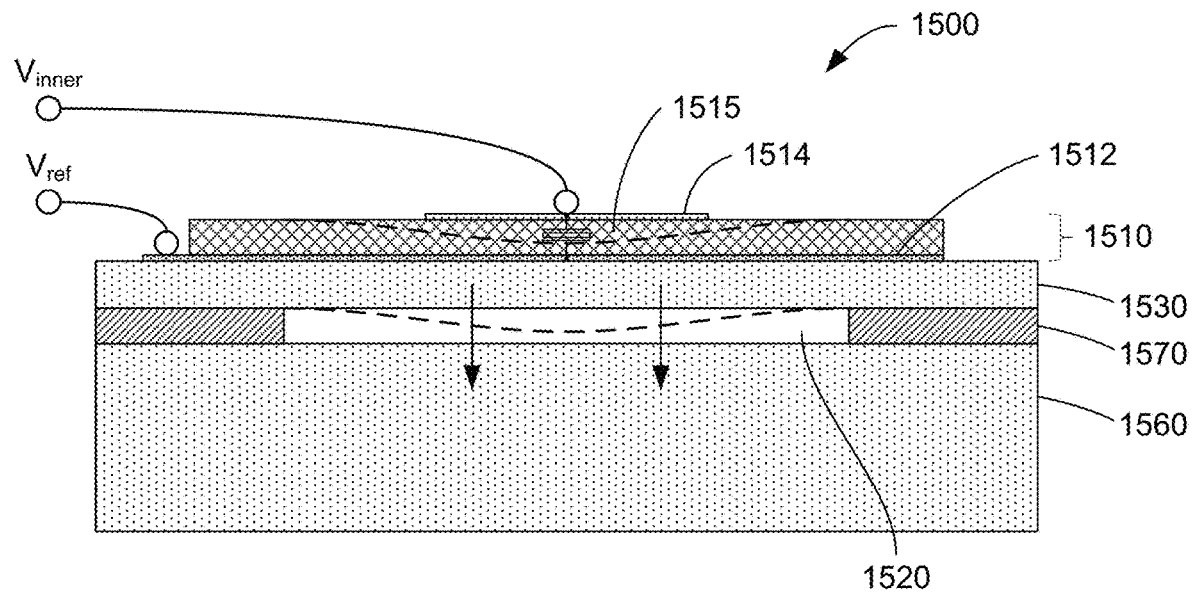
Figure 15B:
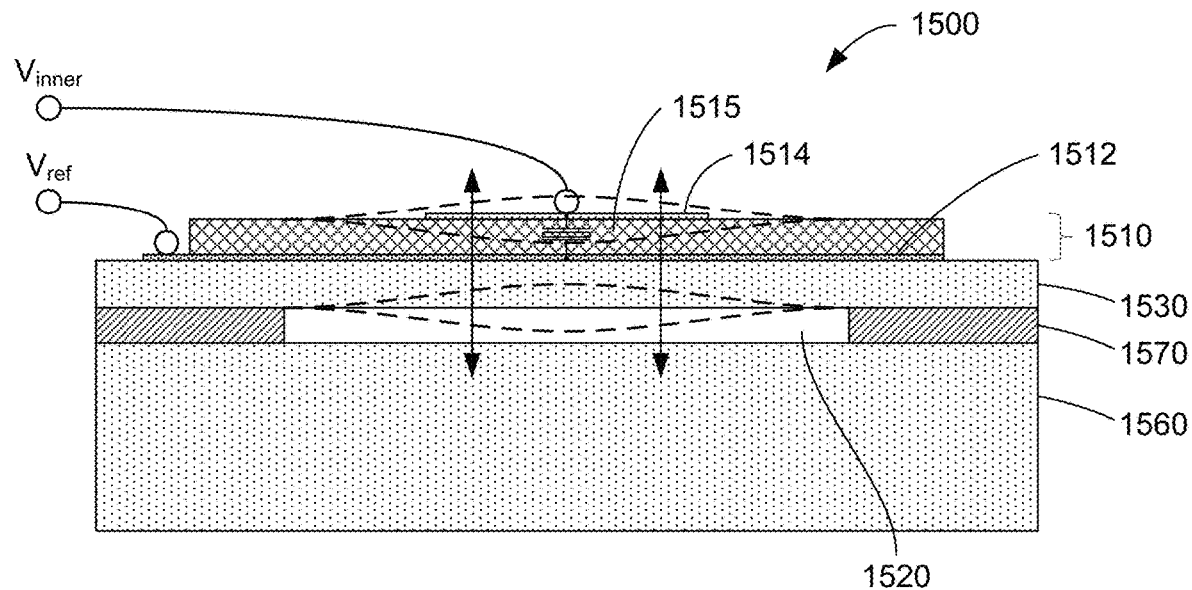
Figure 15C:
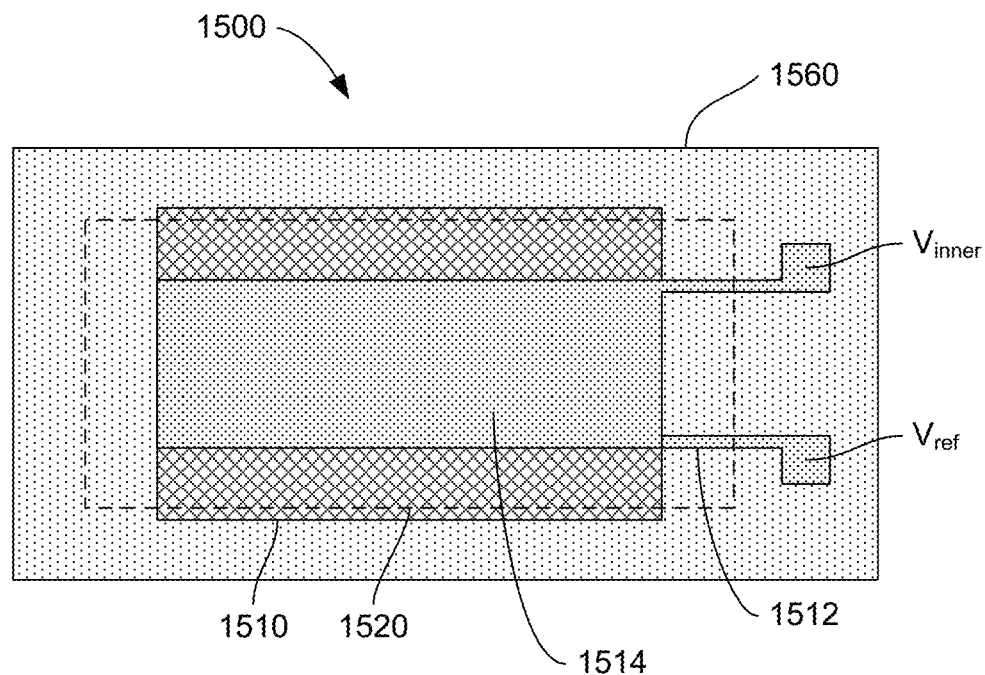
Figure 15D:
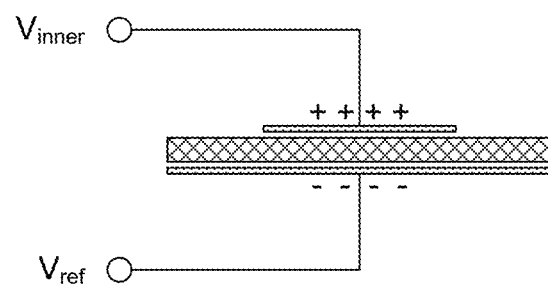

For example, as described above with respect to FIGS. 10 and 11, PMUT sensor elements that are used for non-ultrasonic force detection as well for ultrasonic imaging may have a different geometry than PMUT sensor elements that are used only for ultrasonic imaging. FIGS. 15A and 15B illustrate side views of an example of a two-port PMUT sensor element 1500 having a rectangular geometry operating in a non-ultrasonic force detection mode and an ultrasonic imaging mode, respectively. FIG. 15C shows a top view of the PMUT sensor element 1500 shown in FIGS. 15A and 15B. FIG. 15D shows an equivalent circuit for the PMUT sensor element shown in FIGS. 15A and 15B.

The PMUT sensor element 1500 includes a piezoelectric layer stack 1510 and a mechanical layer 1530 disposed so as to form a deformable diaphragm supported by an anchor structure 1570 over a cavity 1520. The cavity 1520 may be formed in or on a substrate 1560. The piezoelectric layer stack 1510 includes a piezoelectric layer 1515, a lower electrode 1512 and an upper electrode 1514. The upper electrode 1514 is also referred to as an inner electrode. FIG. 15A is a side view of the PMUT sensor element 1500 with static displacement due to applied force as described above with respect to FIG. 1C. FIG. 15B is a side view of the PMUT sensor element 1500 with dynamic displacement due to ultrasonic wave generation and detection as described above with respect to FIG. 1D.

Figure 16A:
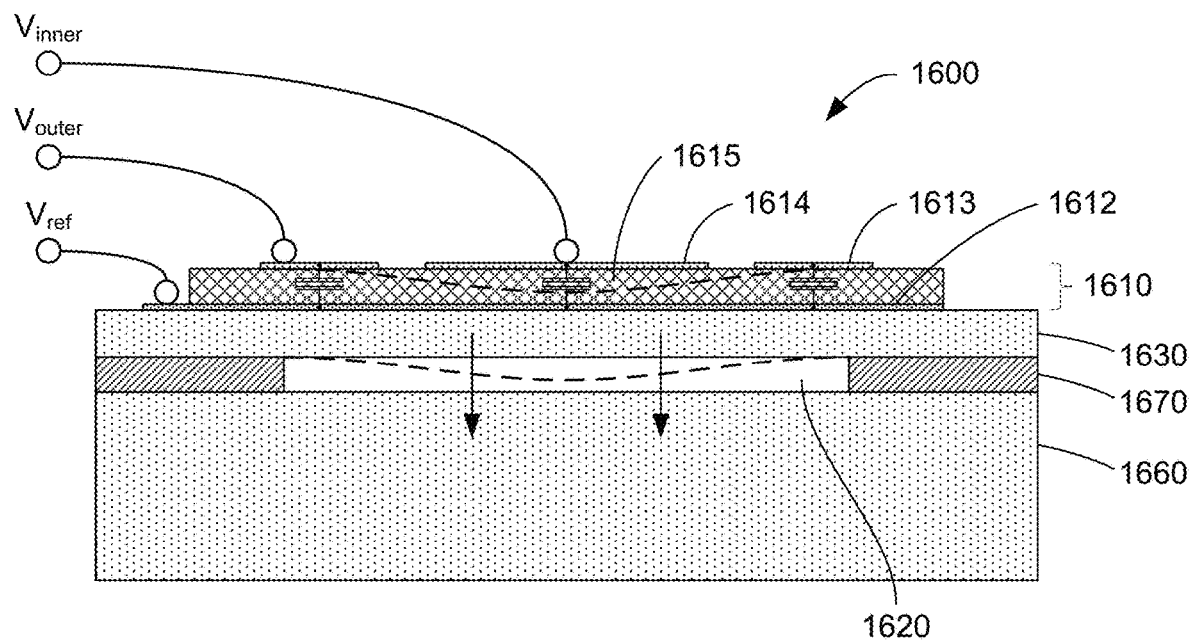
Figure 16B:
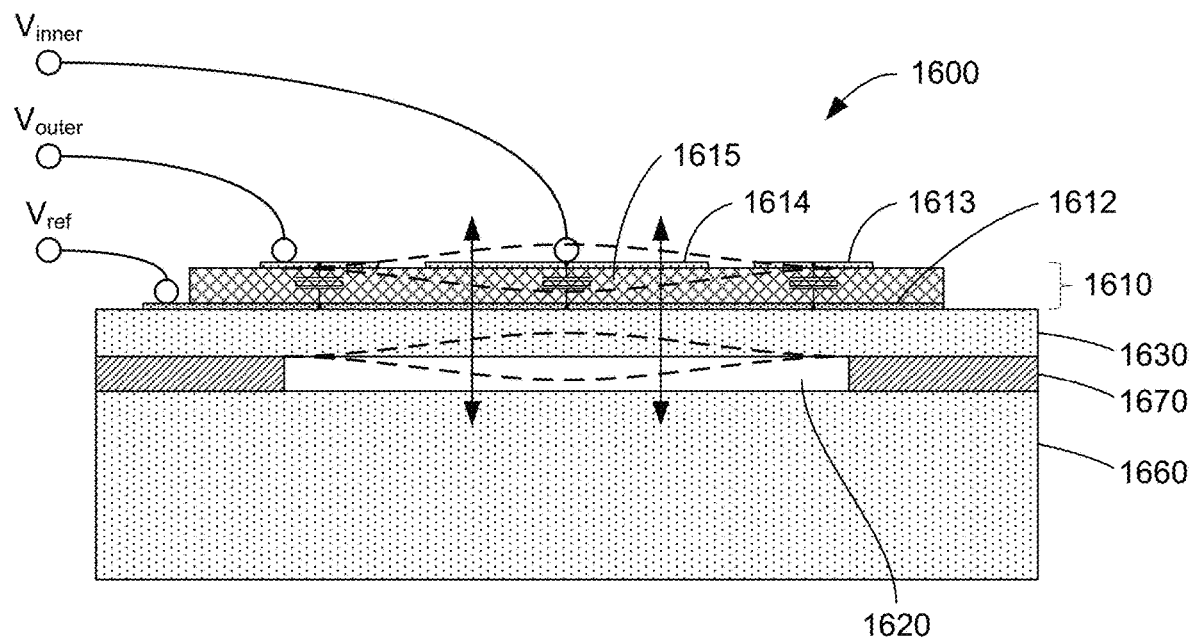
Figure 16C:
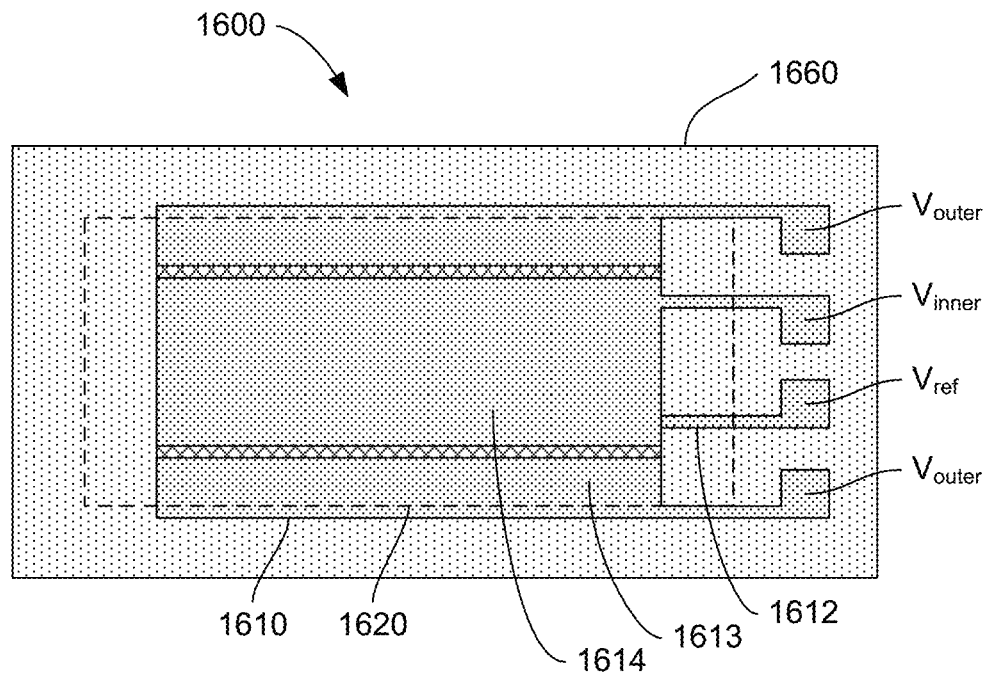
Figure 16D:
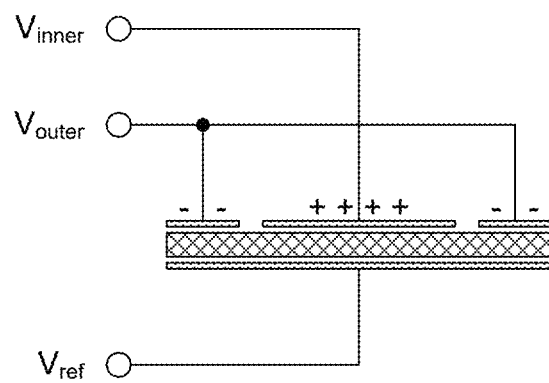

FIGS. 16A and 16B illustrate side views of an example of a three-port PMUT sensor element 1600 having a rectangular geometry operating in a non-ultrasonic force detection mode and ultrasonic imaging mode, respectively. FIG. 16C shows a top view of the PMUT sensor element 1600 shown in FIGS. 16A and 16B. FIG. 16D shows an equivalent circuit for the PMUT sensor element shown in FIGS. 16A and 16B.

The PMUT sensor element 1600 includes a piezoelectric layer stack 1610 and a mechanical layer 1630 disposed so as to form a deformable diaphragm supported by an anchor structure 1670 over a cavity 1620. The cavity 1620 may be formed in or on a substrate 1660. The piezoelectric layer stack 1610 includes a piezoelectric layer 1615, a lower electrode 1612 and two upper electrodes: an inner electrode 1614 and outer electrode 1613.

As described above with respect to FIG. 14, the inner electrode 1614, outer electrode 1613, and lower electrode 1612 may be electrically coupled with transceiver circuitry and may function as separate electrodes providing signal transmission, signal reception, and a common reference or ground. FIG. 16A is a side view of the PMUT sensor element 1600 with static displacement due to applied force. As described above with respect to FIG. 1C, in operation, the piezoelectric layer stack 1610 and the mechanical layer 1630 may be caused to bend in response to an applied force, which the PMUT sensor element converts to an electrical signal that may be read by the transceiver circuitry.

FIG. 16B is a side view of the PMUT sensor element 1600 with dynamic displacement due to ultrasonic wave generation and detection. As described above with respect to FIG. 1D, during operation in an ultrasonic imaging mode, the piezoelectric layer stack 1610 and the mechanical layer 1630 may be caused to bend and vibrate in response to a time-varying excitation voltage applied across the inner electrode 1614 and/or outer electrode 1613 by the transceiver circuitry.

Figure 17A:
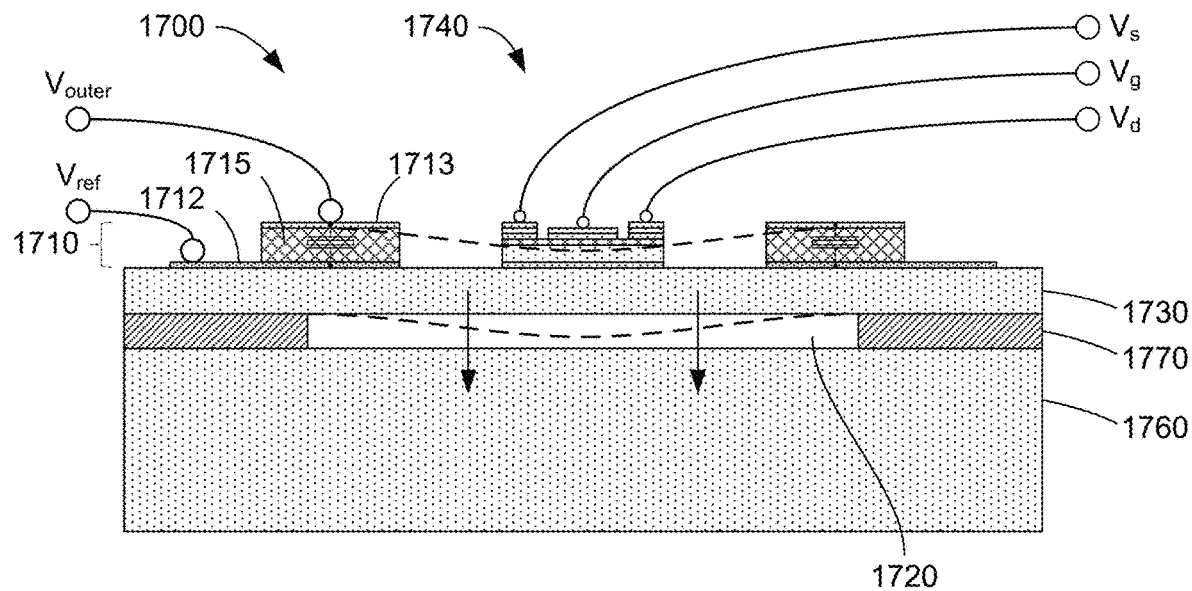
Figure 17B:
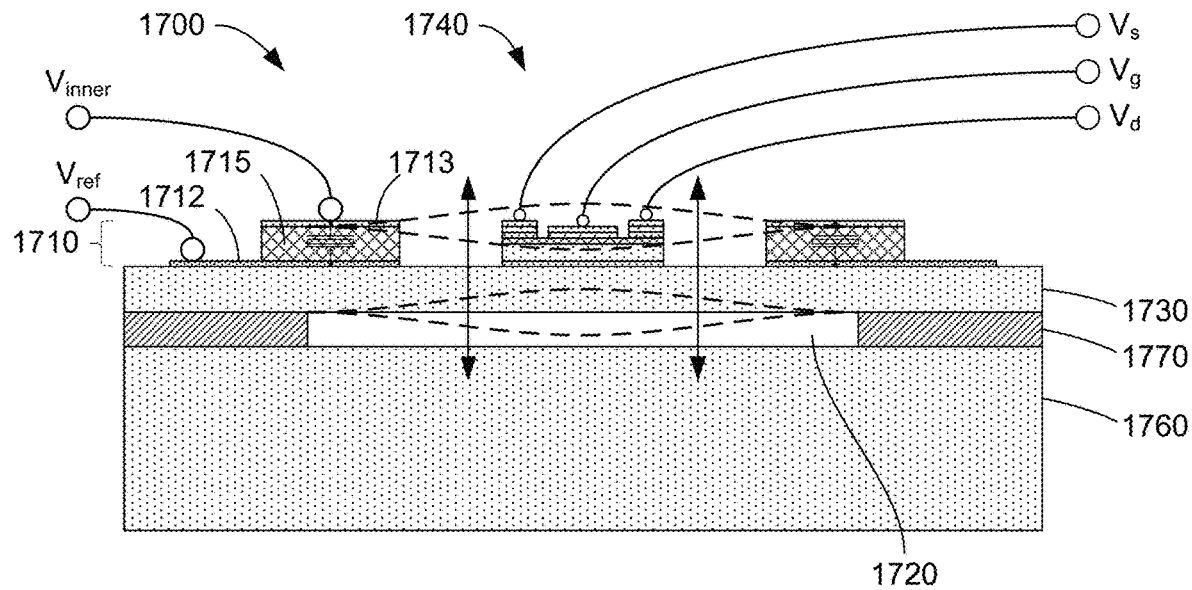
Figure 17C:
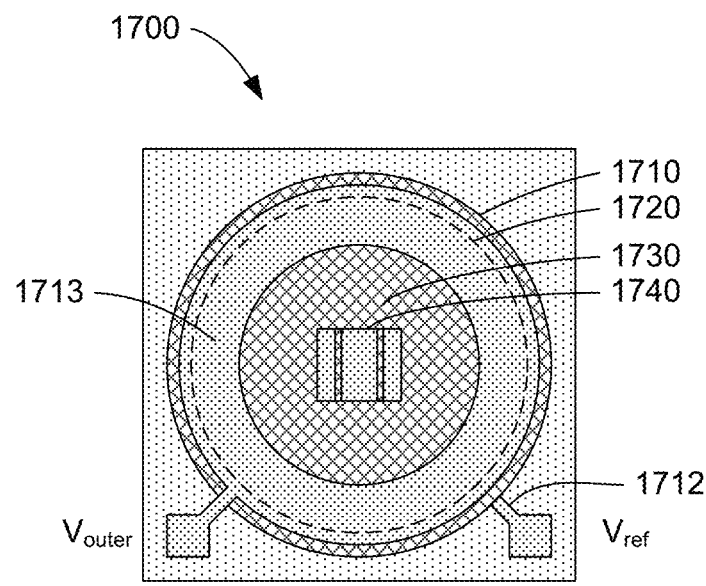
Figure 17D:
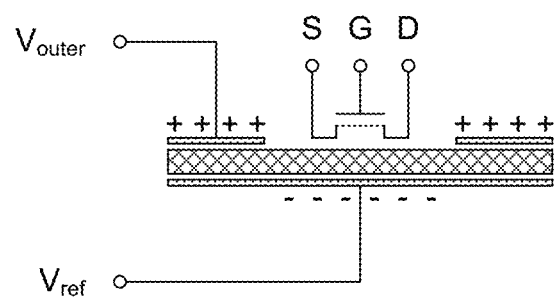

FIGS. 17A-17D illustrate an example of a PMUT sensor element 1700 that includes a 2-D electron gas structure. The example of FIG. 17A-17D is similar to that described above with respect to FIGS. 7A-7D with the upper electrode being an outer electrode, rather than an inner electrode. FIGS. 17A and 17B illustrate side views of an example of the PMUT sensor element 1700 operating in a non-ultrasonic force detection mode and ultrasonic imaging mode, respectively. FIG. 17C shows a top view of the PMUT sensor element 1700 shown in FIGS. 17A and 17B. FIG. 17D shows an equivalent circuit for the PMUT sensor element shown in FIGS. 17A and 17B.

The PMUT sensor element 1700 includes a 2-D electron gas structure 1740 formed on the mechanical layer 1730 of the PMUT diaphragm. In the example of FIGS. 17A-17C, the 2-D electron gas structure is disposed in the center of a circular diaphragm, rather than on the periphery as shown in FIGS. 7A and 7B. The deformable diaphragm includes a piezoelectric layer stack 1710 and a mechanical layer 1730 supported by an anchor structure 1770 over a cavity 1720. The cavity 1720 may be formed in or on a substrate 1760. The piezoelectric layer stack 1710 includes a piezoelectric layer 1715, a lower electrode 1712 and an upper electrode 1713. The upper electrode 1713 in the illustrated implementation may also be referred to as an outer electrode as it is disposed around an outer peripheral portion of the diaphragm.

FIG. 17A is a side view of the PMUT sensor element 1700 with static displacement due to an applied force. As described above with respect to FIG. 1C, in operation, the piezoelectric layer stack 1710 and the mechanical layer 1730 may be caused to bend in response to an applied force, which the PMUT sensor element 1700 converts to an electrical signal that may be read by the transceiver circuitry.

FIG. 17B is a side view of the PMUT sensor element 1700 with dynamic displacement due to ultrasonic wave generation and detection. As described above with respect to FIG. 1D, during operation in an ultrasonic imaging mode, the piezoelectric layer stack 1710 and the mechanical layer 1730 may be caused to bend and vibrate in response to a time-varying excitation voltage applied across the outer electrode 1713 and the lower electrode 1712 by transceiver circuitry. Similarly, the 2-D electron gas structure 1740 may exhibit mechanical strain during static displacement of the diaphragm with applied force or dynamic displacements of the diaphragm in response to reflected ultrasonic waves, which may result in static or time-varying transistor characteristics that may be detected by the transceiver circuitry.

FIGS. 18A-18D illustrate an example of a process flow for fabricating a sensor element 1800 including a substrate 1860, a diaphragm, and a 2-D electron gas structure 1840 disposed on the diaphragm. The diaphragm may include portions of a mechanical layer 1830 spanning a cavity 1820 with the cavity 1820 positioned between the mechanical layer 1830 and the substrate 1860. The mechanical layer 1830 may be supported over the cavity 1820 by an anchor structure 1870. The substrate 1860 may include one or more piezoelectric layers on the mechanical layer 1830, such as described and illustrated above with respect to PMUT sensor element 700 in FIG. 7A and with respect to PMUT sensor element 1700 in FIG. 17A.

The substrate 1860 may include a glass substrate or a semiconductor substrate such as a silicon substrate, an SOI substrate, or a cavity-SOI substrate. In some implementations, the substrate 1860 may include a cavity-SOI substrate with one or more cavities 1820 formed between a bonded pair of silicon substrates. In some implementations, the substrate 1860 may include one or more sealed cavities formed from surface micromachining processes that allow removal of sacrificial material in the cavity region and subsequent sealing of etch channel regions (not shown) with one or more deposited thin films to establish and retain a prescribed vacuum level within the cavity 1820.

Figure 18A:
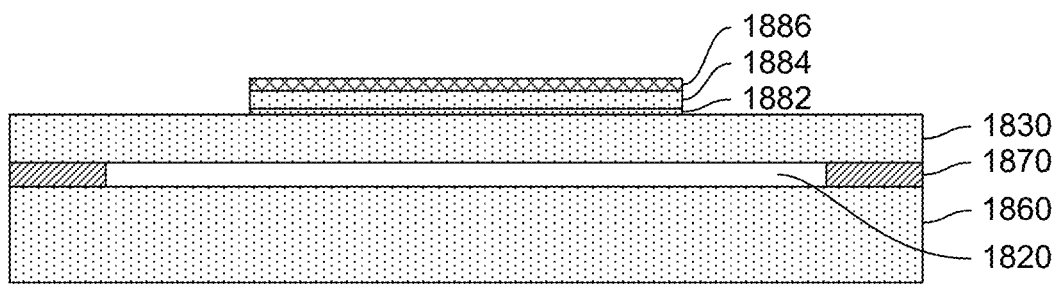
FIGS. 18A-18D illustrate an example of a process flow for fabricating a sensor element including a substrate, a diaphragm, and a 2-D electron gas structure disposed on the diaphragm.

As shown in FIG. 18A, a buffer layer 1882 such as a gallium nitride (GaN) buffer layer may be deposited on the mechanical layer 1830 using, for example, a process such as metalorganic chemical vapor deposition (MOCVD) or molecular-beam epitaxy (MBE). In some implementations, a seed layer of aluminum nitride (AlN) or a seed layer stack of aluminum nitride, molybdenum and aluminum nitride (AlN/Mo/AlN) may serve as the buffer layer 1882. A body layer 1884 such as a GaN body layer may be deposited epitaxially on the buffer layer 1882 using, for example, an MOCVD or MBE process. A gate dielectric layer 1886 such as an aluminum-gallium-nitride (AlGaN) dielectric layer may be deposited on the body layer 1884 using, for example, an MOCVD or MBE process. The gate dielectric layer 1886, the body layer 1884, and the buffer layer 1882 may be patterned and etched using, for example, a photolithographic process with a photo-sensitive material (e.g., photoresist) that serves as a mask for dry etching (e.g., plasma etching or reactive-ion etching) the AlGaN and GaN layers to form the body of the 2-D electron gas structure 1840.

Figure 18B:
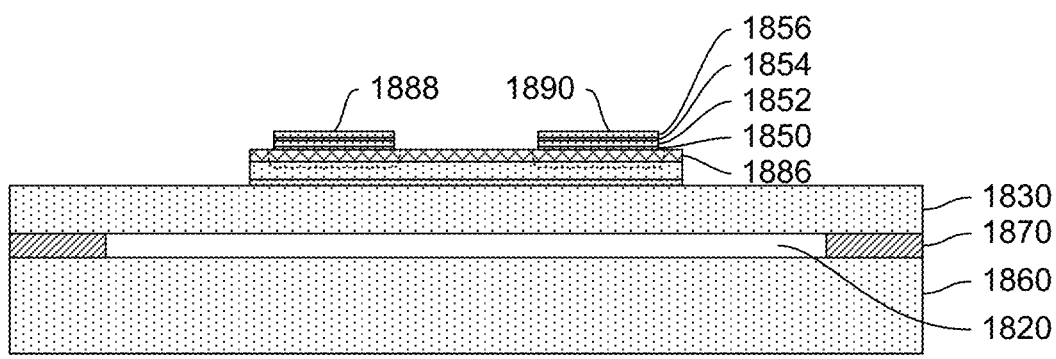

As shown in FIG. 18B, a source stack 1888 and a drain stack 1890 may be formed on the gate dielectric layer 1886. The source stack 1888 and the drain stack 1890 may be formed by depositing a barrier layer 1850 of titanium on the gate dielectric layer 1886, followed by depositing a conductive layer 1852 of aluminum, a second barrier layer 1854 of nickel, and a second conductive layer 1856 of gold. The conductive layer 1856, the barrier layer 1854, the conductive layer 1852, and barrier layer 1850 may be patterned and etched using a photolithographic process and stopping on the gate dielectric layer 1886 to form the source stack 1888 and drain stack 1890. Alternatively, the barrier layer 1850, conductive layer 1852, barrier layer 1854, and the conductive layer 1856 may be patterned and etched using a lift-off process where the layers are deposited on a patterned photoresist layer with openings in the source and drain regions and where the photoresist layer is subsequently removed using a wet or dry etch process along with portions of the overlying conductive and barrier layers, leaving the conductive and barrier layers in the source and drain regions intact to form the source stack 1888 and the drain stack 1890. An annealing sequence such as a rapid thermal anneal (RTA) sequence may be used to anneal the substrate 1860 and layers formed thereon including the source stack 1888 and the drain stack 1890, and to drive in dopant from the source and drain stacks through the gate dielectric layer 1886 and into the body layer 1884.

Figure 18C:
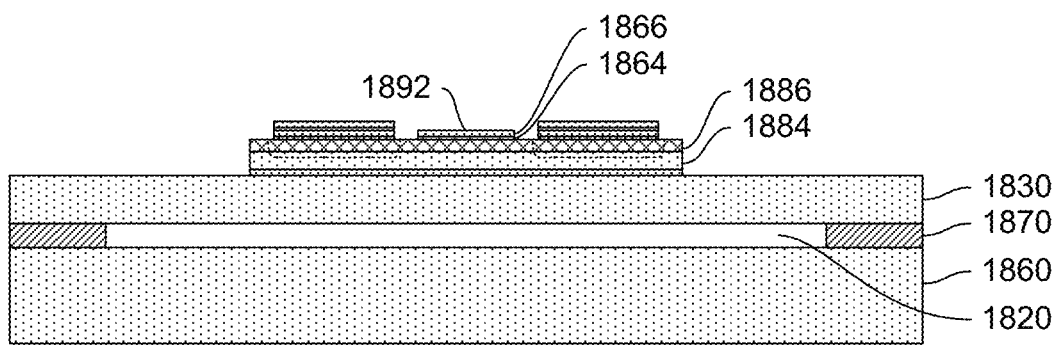

A gate stack 1892 may be formed on the gate dielectric layer 1886, as shown in FIG. 18C. A barrier layer 1864 of nickel and a conductive layer 1866 of gold may be deposited on the gate dielectric layer 1886 using, for example, sputtering or evaporative processes followed by patterning and etching of the conductive layer 1866 and barrier layer 1864. Alternatively, the gate stack 1892 may be formed using a lift-off process with deposited barrier and conductive layers.

Figure 18D:
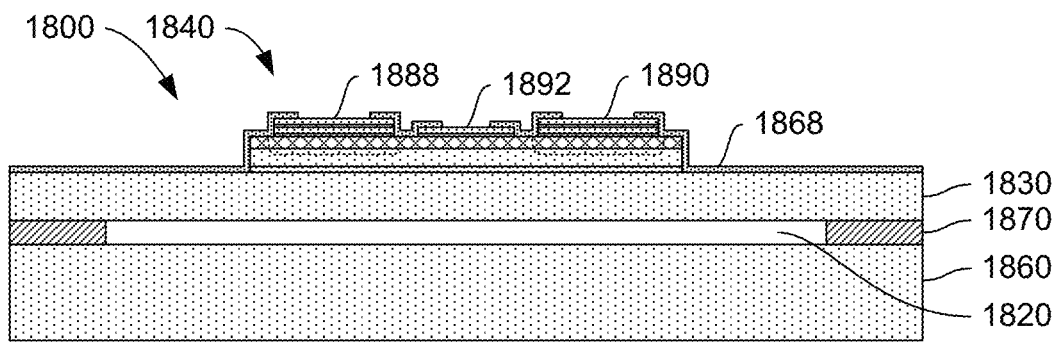

A passivation layer 1868 such as a layer of silicon nitride may be deposited over the exposed portions of substrate 1860 including the source stack 1888, the gate stack 1892, and the drain stack 1890, as shown in FIG. 18D. The passivation layer 1868 may be patterned and etched to form contact openings and to expose outer portions of the source stack 1888, the gate stack 1892, and the drain stack 1890. One or more layers of interconnect metal (not shown) may be used to provide electrical connections to the source, gate, and drain of the 2-D electron gas structure 1840. In some implementations, a transfer process may be used to transfer MBE- and MOCVD-deposited materials from a carrier substrate (not shown) onto the mechanical layer 1830 or substrate 1860.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor or any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, i.e., one or more modules of computer program instructions, encoded on a computer storage media for execution by or to control the operation of data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module which may reside on a computer-readable medium. Computer-readable media include both computer storage media and communication media including any medium that may be enabled to transfer a computer program from one place to another. Storage media may be any available media that may be accessed by a computer. By way of example, and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, as a person having ordinary skill in the art will readily appreciate, the terms "upper" and "lower", "top" and "bottom", "front" and "back", and "over", "overlying", "on", "under" and "underlying" are sometimes used for ease of describing the figures and indicate relative positions corresponding to the orientation of the figure on a properly oriented page, and may not reflect the proper orientation of the device as implemented.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed to achieve desirable results. Further, the drawings may schematically depict one more example processes in the form of a flow diagram. However, other operations that are not depicted may be incorporated in the example processes that are schematically illustrated. For example, one or more additional operations may be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, other implementations are within the scope of the following claims. In some cases, the actions recited in the claims may be performed in a different order and still achieve desirable results.

What is claimed is:

1. An apparatus comprising:
   a substrate;
   a sensor including an array of piezoelectric micromechanical ultrasonic transducer (PMUT) sensor elements on the substrate, wherein each PMUT sensor element includes a diaphragm having a piezoelectric layer and a mechanical layer, wherein the diaphragm is capable of a static displacement upon application of an applied force and is capable of a dynamic displacement when the PMUT sensor element receives or transmits ultrasonic signals; and
   a sensor controller configured to switch the sensor between a non-ultrasonic force detection mode and an ultrasonic imaging mode for one or more of the PMUT sensor elements, wherein the applied force is measured in the non-ultrasonic force detection mode and wherein an object is imaged ultrasonically during the ultrasonic imaging mode.

2. The apparatus of claim 1, wherein the apparatus is configured to detect a finger touch based on an on-threshold force being measured by the apparatus in the non-ultrasonic force detection mode.

3. The apparatus of claim 2, wherein the sensor controller is configured to provide, to an applications processor, a wake-up signal to activate one or more wake-up operations after the finger touch is detected.

4. The apparatus of claim 2, wherein the apparatus is configured to detect a finger lift after a detecting the finger touch based on an off-threshold force being measured by the apparatus in the non-ultrasonic force detection mode.

5. The apparatus of claim 4, wherein the off-threshold force is less than the on-threshold force.

6. The apparatus of claim 3, wherein the sensor controller is configured to initialize the ultrasonic imaging mode after the finger touch is detected.

7. The apparatus of claim 1, wherein the sensor controller is configured to initialize the ultrasonic imaging mode based on a minimum imaging threshold force being measured by the apparatus in the non-ultrasonic force detection mode.

8. The apparatus of claim 1, wherein one or more of the PMUT sensor elements includes a 2-D electron gas structure disposed on the diaphragm.

9. The apparatus of claim 1, wherein the sensor controller is configured to switch between the non-ultrasonic force detection mode and an ultrasonic imaging mode for each of the PMUT sensor elements in the array of PMUT sensor elements.

10. The apparatus of claim 1, wherein the sensor controller is configured to switch between the non-ultrasonic force detection mode and an ultrasonic imaging mode for a subset of the PMUT sensor elements in the array of PMUT sensor elements.

11. The apparatus of claim 10, wherein the subset of the PMUT sensor elements are located at the periphery of the array of PMUT sensor elements.

12. The apparatus of claim 10, wherein the PMUT sensor elements of the subset of the PMUT sensor elements differ from a remainder of the PMUT sensor elements of the array of PMUT sensor elements in one or more of a shape or a size.

* * * * *